(12) United States Patent
Besterman et al.

(10) Patent No.: US 9,549,480 B1
(45) Date of Patent: Jan. 17, 2017

(54) CONFIGURABLE DOOR PANELS

(71) Applicant: International Business Machines Corporation, Armonk, NY (US)

(72) Inventors: Paula Besterman, Charlotte, NC (US); Aaron R. Cox, Tucson, AZ (US); Camillo Sassano, Durham, NC (US); Kevin L. Schultz, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/099,066

(22) Filed: Apr. 14, 2016

Related U.S. Application Data

(63) Continuation of application No. 14/921,131, filed on Oct. 23, 2015.

(51) Int. Cl.
 *H05K 5/02* (2006.01)
 *H05K 7/18* (2006.01)
 *H05K 7/20* (2006.01)
 *H05K 5/03* (2006.01)
 *H05K 5/00* (2006.01)
 *H05K 7/14* (2006.01)
 *H05K 9/00* (2006.01)

(52) U.S. Cl.
 CPC .............. *H05K 5/03* (2013.01); *H05K 5/0204* (2013.01)

(58) Field of Classification Search
 CPC ...... H05K 5/03; H05K 5/0204; H05K 5/0217; H05K 5/0239; H05K 9/0081; H05K 9/0071; H05K 9/0041; H05K 7/20145
 USPC ........ 181/198, 201, 287; 361/689, 695, 690, 361/818
 See application file for complete search history.

(56) References Cited

U.S. PATENT DOCUMENTS

| 1,675,102 | A | * | 6/1928 | Holland | ................. | G10K 11/20 |
| | | | | | | 181/287 |
| 1,975,604 | A | * | 10/1934 | Hanson | ................... | E04B 1/994 |
| | | | | | | 181/287 |
| 4,399,485 | A | * | 8/1983 | Wright | ............... | H05K 7/20009 |
| | | | | | | 165/80.3 |

(Continued)

FOREIGN PATENT DOCUMENTS

EP 1983814 A2 10/2008

OTHER PUBLICATIONS

"Rackmount Solutions 44U AcoustiQuiet Sound Proof Server Cabinet, 36"d," ServerRack.com, pp. 1-2, (printed Jul. 1, 2015). http://www.serverrack.com/rackmount-solutions-aq772036-44u-acoustiquiet-sound-proof-server-cabinet-36-inches-deep/.

(Continued)

*Primary Examiner* — Edgardo San Martin
(74) *Attorney, Agent, or Firm* — Nathan M. Rau

(57) ABSTRACT

A configurable door panel cover includes a first face of a first door that is perforated and includes one or more attachment points, which one or more configurable panels may attach to. The configurable door panel cover includes a fastener assembly that includes at least one fastener that attaches to the configurable door panel cover, and a spacing mechanism. The spacing mechanism attaches to the fastener that is attached to the configurable door panel cover and to one of the one or more attachment points on the first face of the first door. The spacing mechanism attaches the first configurable door panel cover at a first orientation that includes a first angle between the configurable door panel cover and the first spacing mechanism. The fastener assembly may be rotated to the configurable door panel cover.

1 Claim, 12 Drawing Sheets

(56) References Cited

U.S. PATENT DOCUMENTS

| | | | |
|---|---|---|---|
| 5,297,004 A | | 3/1994 | Mazura |
| 5,782,546 A | * | 7/1998 | Iwatare ................. H05K 9/0041 312/236 |
| 6,506,111 B2 | * | 1/2003 | Sharp ................. H05K 7/20754 165/122 |
| 7,182,208 B2 | * | 2/2007 | Tachibana .......... H05K 7/20572 211/26 |
| 7,400,501 B2 | | 7/2008 | Bartell et al. |
| 7,646,603 B2 | | 1/2010 | Bard et al. |
| 7,761,209 B2 | * | 7/2010 | Morris ...................... E05F 5/00 340/901 |
| 8,028,793 B2 | | 10/2011 | Bard |
| 8,074,765 B2 | | 12/2011 | Goto et al. |
| 8,355,252 B2 | | 1/2013 | Chan et al. |
| D694,247 S | * | 11/2013 | Besterman ................... D14/301 |
| 8,573,356 B1 | * | 11/2013 | Perdue ................... E04B 1/994 181/284 |
| 8,898,979 B2 | * | 12/2014 | Besterman ........... H05K 7/1455 312/223.2 |
| 2004/0218355 A1 | * | 11/2004 | Bash .................. H05K 7/20745 361/690 |
| 2008/0106864 A1 | | 5/2008 | Merino |
| 2009/0122484 A1 | * | 5/2009 | Caveney ............ H05K 7/20736 361/692 |
| 2010/0198426 A1 | * | 8/2010 | Kondo ................... G10K 11/28 700/302 |
| 2011/0085300 A1 | | 4/2011 | Sivanandan et al. |
| 2011/0148261 A1 | | 6/2011 | Donowho et al. |
| 2011/0175504 A1 | | 7/2011 | Cook |
| 2015/0060375 A1 | | 3/2015 | Love, II et al. |
| 2015/0079893 A1 | | 3/2015 | Li et al. |
| 2015/0334872 A1 | * | 11/2015 | Cox ..................... H05K 5/0217 454/184 |

OTHER PUBLICATIONS

"UCoustic™ Sound Proof Enclosures," UCoustic Cab; Product Brochure—Rackmount Solutions, 9 pages, (document received: Apr. 17, 2015).

Besterman et al., "Configurable Door Panels," U.S. Appl. No. 14/921,131, filed Oct. 23, 2015.

List of IBM Patents or Patent Applications Treated as Related, signed Aug. 25, 2016, 2 pages.

* cited by examiner

CONFIGURABLE DOOR PANELS

BACKGROUND

Aspects of the present disclosure relate to door panels, and more particular aspects relate to door panels that are configurable based on thermal or acoustic needs of an enclosure of a computing device.

Enclosures may protect computer components of computing devices such as personal computers or computer server systems from outside forces. Enclosures may include a structural support that includes one or more walls. One of the one or more walls is a door that a user may open to access the computer components within the enclosure. Enclosures of computing devices may protect the sometimes-fragile computer components within the enclosure from outside forces.

SUMMARY

According to embodiments of the present disclosure, a configurable door apparatus, a method for altering the configurable door apparatus, and a method for modifying the configurable door apparatus are proposed to alter one or more environmental factors of an enclosure containing computing equipment. Altering one or more environmental factors may include thermal properties within the enclosure, acoustical attenuation outside the enclosure, and/or electromagnetic frequencies outside the enclosure. The one or more environmental factors may be altered by adding, removing, substituting, or changing the orientation of one or more configurable door panel covers attached to a first face of a door of the enclosure.

One embodiment provides a configurable door panel cover apparatus. The configurable door panel cover apparatus includes a first face of a first door that is perforated and includes one or more attachment points, which one or more configurable panels may attach to. The apparatus includes one or more configurable door panel covers, including a first configurable door panel cover. The apparatus includes a fastener assembly that includes at least one fastener that attaches to the first configurable door panel cover, and a spacing mechanism. The spacing mechanism attaches to the fastener that is attached to the configurable door panel cover and to one of the one or more attachment points on the first face of the first door. The spacing mechanism attaches the first configurable door panel cover at a first orientation that includes a first angle between the configurable door panel cover and the first spacing mechanism. The fastener assembly may be rotated in a perpendicular plane to the configurable door panel cover.

Another embodiment provides a method for selecting a first configurable door panel cover. The method includes measuring a first environmental factor. The method includes determining that the first environmental factor has reached a first threshold. The method includes selecting a first configurable door panel cover, in response to the determination of the threshold of the first environmental factor. The method includes attaching the first configurable door panel cover to a perforated first face of a first door at a first location and a first orientation. The first orientation is provided by a fastener assembly. The fastener assembly includes at least one fastener and a spacing mechanism. The spacing mechanism attaches the first configurable door panel cover the one or more attachment points at the first location on the first face of the first door. The spacing mechanism is attached at a first length that creates a first angle between the configurable door panel cover and the spacing mechanism. The method includes measuring a second environmental factor. The method includes determining that the second environmental factor has reached a second threshold. The method includes altering the first orientation of the first configurable door panel cover to a second orientation, in response to the second threshold being reached. The second orientation is provided by the spacing mechanism at a second length that creates a second angle between the configurable door panel cover and the spacing mechanism.

Yet another embodiment provides a method for attaching a configurable door panel cover. The method includes selecting a first configurable door panel cover. The method includes determining a first location on a first face of a first door that is perforated and includes one or more attachment points. The method includes determining a first orientation of the first configurable door panel cover. The method includes attaching the first configurable door panel cover to the first face of the first door at the first location and the first orientation with a fastener assembly. The fastener assembly includes at least one fastener and a spacing mechanism. The fastener attaches the first configurable door panel cover to the spacing mechanism. The spacing mechanism includes a first configuration that attaches the fastener to the one or more attachment points at the first location on the first face of the first door. The first configuration includes a first spacing mechanism of a first length, which produces the first orientation and a first angle between the configurable door panel cover and the first spacing mechanism.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1A:
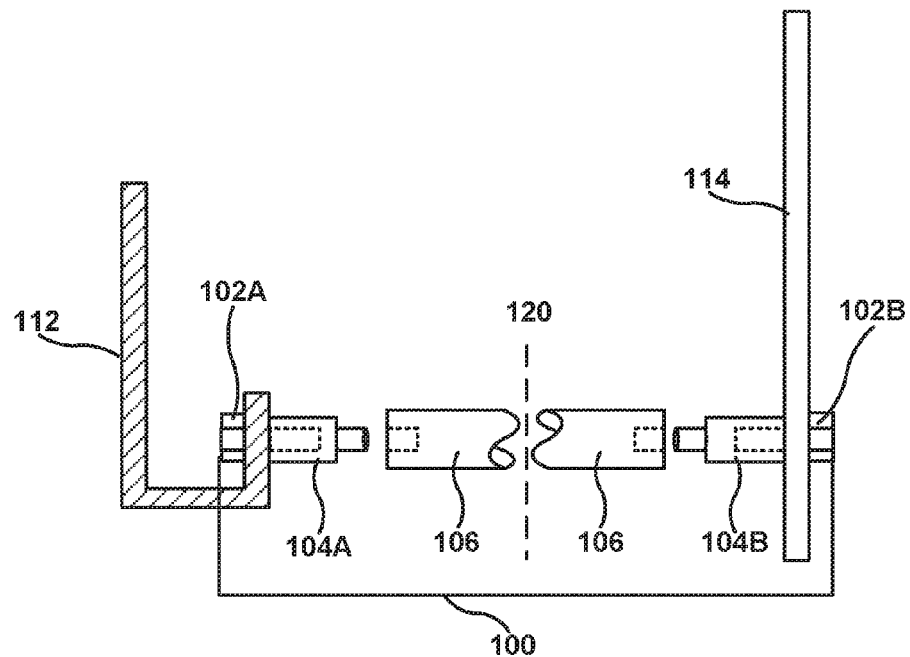
FIG. 1A depicts a configurable door panel cover being fastened to a door panel of an enclosure, according to embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure provide a configurable door panel cover apparatus, a method for altering a first configurable door panel cover, and a method for modifying an assembly of a first configurable door cover based on thermal or acoustical environmental factors of an enclosure of a computing device. The enclosure may include one or more components. The one or more components may output heat. The outputted heat, by the one or more components, may require airflow to cool the one or more components. The configurable door panel covers, herein referred to as configurable panels, may be oriented to allow more airflow to the one or more components. The one or more components may also output audial noise, or electromagnetic radiation. To reduce the outputted audial noise or electromagnetic radiation an orientation of the configurable panels may be adjusted to block or reduce the sound pressure or electromagnetic radiation. The configurable door panel's location or orientation may be altered. This can alter the thermal properties within the enclosure, the audial noise outside the enclosure, or the electromagnetic radiation outside the enclosure.

Enclosures may seal off or protect components that are within the enclosure. Enclosures may be an artificial container that stores one or more components, e.g. computing components, power supplies, or server blades. An example of an enclosure may include a server rack, a computer case, or a hard case surrounding computing components that protect the computing components from outside forces. The enclosure may include a rigid structure, door for access to the one or more components, perforation to allow airflow to enter the enclosure being distributed to the components, and a means of attachment for the one or more components. The enclosure may include one or more walls that when combined (attached) may create a cavity that is accessible when one of the walls is configured to be a door. For example, a structure of the enclosure may be a three-dimensional (3D) box with six walls, a top, a bottom, and four sides. One of the walls may be configured to be a door that allows access to the cavity created by assembling the five walls and the door. In an additional example, the structure may be a 3D cylinder where two walls may be connected by a circular tube. A door may be constructed on the two walls or cut into the circular tube. The door may be used for securing the one or more components, acoustical attenuation for the one or more components, a visual barrier from the one or more components, or a branding element. The visual barrier or branding elements of the enclosure door may include different finishes, materials, colors, or 3D designs.

The door of the enclosure may be perforated to allow airflow through the door while still protecting the components within the enclosure. The door may be a base layer such that the configurable panel may be attached to create an outer layer. The door may be constructed to include a first face and a second face. The first face may be a first planar surface oriented such that it is facing away from the cavity created by the construction of the enclosure, and the second face may be oriented such that it is facing into the cavity created by the construction of the enclosure. The first face and second face of the door may be parallel to each other creating a plane that may be parallel or askew to the configurable door panels when the configurable panels are attached. The configurable panels may be detachable where the configurable panels may be swapped or adjusted. A detachable configurable panel may include an easy to detach (remove) the configurable panel from a door of an enclosure. The detachable configurable panel may be detached for example by removing the fastener assembly or a quick detach system. The door may include one or more attachment points to which the configurable panels may be attached. The door of the enclosure will be described further herein.

When changing the one or more components within enclosures typically alterations need to be made to the enclosure as well. An addition of a new component to the one or more components of the enclosure may require special tooling, or even a new enclosure. An addition of the new component may decrease the airflow received by other components, or increase the acoustic (sound) issues outputted from the enclosure. To solve the airflow or acoustic issues, a new customized door may need to be manufactured and installed on the enclosure. Airflow to the one or more components or sound outputted from the one or more components within the enclosure varies from enclosure to enclosure, and a specific solution may be required for every addition, subtraction, or substitution of a component to or from the enclosure. Instead, configurable panel may be used to modify the door of the enclosure based on all of the one or more components within the enclosure whether they are new or old.

In various embodiments, the configurable panels may be removed and attached without opening the enclosure. Allowing the configurable panels to be altered without opening the enclosure may increase the security of the one or more components within the enclosure. By keeping the enclosure closed and secured when altering the panels, the one or more components may not be damaged or moved.

The visual aesthetics or branding of the enclosure may require alteration based on changes made to the enclosure. Visual branding, color palate, and 3D design may be required when an enclosure is manufactured for an end user (company, user) or may need to be changed if an enclosure is sold to a third party. For example, a company may request a specific 3D design of the enclosure, a specific color palate, and their logo visually branded on the door of the enclosure. An example of a 3D design of the configurable panel may include a solid shape that includes a length, a width, and a depth that creates a physical structure. The visual aesthetics of the enclosure may be made to the specifications the company requested, the efficiency may be tested, and the new enclosure may be distributed to the company. If a second company purchased the exact same enclosure but with different aesthetics, then the enclosure may require a significant change to the design and may require a second testing process. Instead, a configurable enclosure may be produced, herein referred to as an enclosure. The enclosure may include one or more configurable panels and attachment means to attach the configurable panes to the enclosure may be used to create an enclosure system based on the needs of the company ordering the enclosure.

The configurable panels may be created in multiple sizes and shapes, or made of different materials, and qualities. The different combination of the type of construction and the materials of construction may allow for many various configurations and individualized styles for end users. By changing just a few configurable panels, the efficiency of the door may be increased when compared to the original configuration. The configurable panels may also extend the lifetime of the enclosure. For example, a second configurable panel with attributes for sound reductive purposes may replace a first configurable panel with no attributes based on an upgrade of the components within the enclosure.

The configurable panels may be used to alter the airflow entering the enclosure, dampening the acoustic noise leaving the enclosure, reducing the electromagnetic radiation leaving the enclosure, or for visual aesthetics. Depending of the components of the enclosure and the end user of the enclosure the needs of the enclosure may change. Having an enclosure, configurable panels, and means for attaching the configurable panels to the enclosure may allow for multiple differentiated but customized enclosures based on the needs of the user.

If an additional component is added to the one or more components within the enclosure, then the requirements of the components within the enclosure may change. The requirements may include increased airflow, the one or more components may output more acoustic noise, and/or the new component may increase the output of electromagnetic radiation. The new component may cause configurable panels to be added, detached, substituted, reoriented, or the distance of the means for attachment may be changed. For example, a new component may be added and the new component may require additional airflow, an initial configurable panel may be substituted for a smaller panel to allow more airflow to the new component. In an additional example, the new component may operate and output an increased acoustic noise, an initial configurable panel may be substituted for a configurable panel that includes a sound dampening foam to reduce the outputted acoustic noise from the new component. The orientation, changing of or means of attachment of panels based on the needs of the enclosure will be described further herein.

The enclosure may also be altered when a company purchases the enclosure from another company. If the enclosure is purchased from a first user by a second user, then the configurable panels may also be changed based on the needs of the second end user. For example, a first company may visually brand their enclosure with red configurable panels, including their logo, and a wave shaped 3D design. When it comes time to upgrade, a second company may purchase the enclosure from the first company. The second company may then remove the configurable panels of the first company and install their own, blue configurable panels, including their logo, and a triangular shaped 3D design.

The configurable panel may alter one or more environmental factors associated with enclosures containing one or more computing components. Environmental factors may include thermal characteristics, acoustical noise, and/or electromagnetic radiation. The environmental factors may be a risk to the components within the enclosure or to users outside the enclosure. Thermal characteristics may cause damage to the components within the enclosure due to an excess of heat produced within the enclosure. Acoustical noise, and/or electromagnetic radiation may be harmful to users outside the enclosure. Acoustical noise if loud enough may damage the hearing of the user, and electromagnetic radiation may cause dielectric heating that may cause burns on the skin of the user if exposed. Environmental factors and their relation with the configurable panels will be described further in detail herein.

Environmental factors may be selected for determination. A desired environmental factor may be selected and monitored. The desired environmental factor may be monitored until another desired environmental factor is selected. For example, the acoustical noise may be selected as the desired environmental factor and a location may be selected such as outside the top left of the front of the door of the enclosure. Desired environmental factor may be used interchangeably with environmental factor herein.

The configurable panels may alter the thermal characteristics of the components within the enclosure by orienting the configurable panels to intake or direct the airflow to certain components. Depending on the components within the enclosure, certain components may require additional airflow when compared to other components of the enclosure. To direct the airflow to the components within the enclosure, one or more configurable panels may be orientated such that a gap for intaking airflow may be present for the intake of airflow. For example, a component may require additional airflow when compared to other components within the enclosure. The one or more configurable panels may be orientated such that a gap may be present directly in front of the component requiring the additional airflow. To increase the airflow that may be measured inside the enclosure, the distance between the configurable panels may be increased. For example, the configurable panel may be a distance of 2 inches away from the door of the enclosure. The distance of the door panel may be increased by increasing the length of a fastener assembly to a distance of 3 inches away from the door of the enclosure. The one or more configurable panels may be angled such that they are not perpendicular (askew) to a face of the door of the enclosure to which they are attached. When compared to a configurable panel parallel to the face of the door of the enclosure the askew panel may intake more airflow from the side further away from the face of the door of the enclosure, and intake less airflow from the side closer to the face of the door of the enclosure. For example, a configurable panel may be attached with a fastener assembly length of 2 inches. The configurable panel may then be detached from the enclosure, and a left side of the configurable panel may be attached with a fastener assembly of 1 inch and the right side of the configurable panel may be attached with a fastener assembly of 3 inches.

The configurable panels may alter the acoustical noise (sound) outputted from the one or more components within the enclosure. The configurable panels may include sound dampening material. The sound dampening material may be a sound dampening foam that faces the door of the enclosure to dampen the sound that is outputted by the enclosure. For example, the configurable panel may be constructed with a hard outer shell with a cavity including sound dampening foam. The sound dampening foam may be orientated such that the foam is facing the perforation of the door of the enclosure. The sound dampening material may include constructing the configurable panels out of a determined shape that is configured to alter the orientation of the sound such that the sound is reflected in a direction, or decreased. For example, the configurable panel may be constructed with a hard outer shell with a first face oriented away from the door, and a second face oriented towards the perforation of the door of the enclosure. The second face may include structures (i.e. a cone) such that the sound outputted from the enclosure is reflected or decreased. To decrease the sound output that may be measured outside the enclosure the distance between the configurable panels may be decreased. For example, the configurable panel may be a distance of 3 inches away from the door of the enclosure. The distance of the door panel may be reduced by decreasing the length of a fastener assembly to a distance of 2 inches away from the door of the enclosure. The one or more configurable panels may be angled such that they are not perpendicular (askew) to a face of the door of the enclosure to which they are attached. When compared to a configurable panel parallel to the face of the door of the enclosure the askew panel may output more sound from the side further away from the face of the door of the enclosure, and output less sound from the side closer to the face of the door of the enclosure. For example, a configurable panel may be attached with a fastener assembly length of 2 inches. The configurable panel may then be detached from the enclosure, and a left side of the configurable panel may be attached with a fastener assembly of 1 inch and the right side of the configurable panel may be attached with a fastener assembly of 3 inches.

The configurable panels may reduce the emission of electromagnetic radiation (EMR) at an electromagnetic frequency (EMF) from the enclosure. Various components within the enclosure may emit (output) EMF that may be damaging to users or other equipment in the surrounding area of the enclosure. The configurable panels may be constructed out of EMF reduction material to reduce the emissions of EMF from the components within the enclosure. The configurable panel may be constructed out of materials that shield the surrounding area from EMF (RF shielding). For example, the configurable panel may be constructed with a hard outer shell protecting an inner portion including materials configured to block EMF. To decrease the EMF emitted from components within the enclosure one or more EMF configurable panels may be attached to the enclosure. The EMF configurable panels may be attached to the front face of the door of the configurable enclosure. The RF shielding panel may be altered by changing the orientation of the RF panel, changing the distance of the RF panel, or substituting panels for the RF panel. For example, an EMF signal being emitted from an enclosure may be reach the threshold of the EMF. The current configurable panel may be substituted for an RF panel to reduce the EMF emissions of the enclosure.

The orientation, location, and/or distance the configurable panel is from the enclosure may increase or decrease the effectiveness of the configurable panel to alter the environmental factors of the enclosure. Depending on how the configurable panel is attached to the enclosure, the effectiveness of the configurable panel may be better or worse if the configurable panel is moved. If a configurable panel is attached close to the first face of the door, then the airflow entering the enclosure may be effected. Sometimes an increase in effectiveness of one parameter may decrease another parameter. For example, if a configurable panel is oriented to decrease the sound output of the enclosure, the configurable panel may be attached 1 inch from the door. The orientation of the configurable panel may decrease the sound output but also decrease the airflow entering the enclosure. The orientation of the configurable panel may increase the efficiency if the airflow may be increased by making the configurable panel askew to the door. For example, if a cooling system (air conditioning) is present in a room that the enclosure is in, the cooling system including ductwork above the enclosures. The configurable panels may be oriented such that a wider opening is toward the cooling system bringing in airflow to the enclosure. The orientation may include a physical position or direction of the configurable panel. For example, the orientation may include the configurable panel being 2 inches away from the first face of the door of the enclosure, at an angle of 5° to the right in relation to a fastener assembly.

The configurable panels may be changed by relocating, removing, substituting, or adding to the door of the enclosure. If a measurement determines that the changing of the configurable panels may increase the efficiency of the enclosure, then the configurable panels may be changed. For example, if the enclosure is emitting an EMF signal above the threshold, then the current panel may be substituted for an EMF panel. In an additional example, if the airflow within the enclosure is below the threshold, then the configurable panel may be detached to increase the airflow in the enclosure. The substitution or a configurable panel may require more than one measurement. If the sound pressure outside the enclosure is above the threshold, the airflow may also be measured during the substitution or relocation of the configurable panel. For example, a current configurable panel may cause the sound pressure to reach the threshold; the configurable panel may be substituted for a second configurable panel. After the substitution, the airflow may be measured to determine if the substitution of the configurable panel caused the airflow within the enclosure to reach the threshold of the airflow. If the airflow within the enclosure has not reached the threshold, then the substitution may be deemed successful.

FIG. 1A depicts a configurable panel being fastened to a door of an enclosure, according to embodiments. A configurable panel 112 is attached to a door 114 of an enclosure with a fastener assembly at one or more attachment points. The fastener assembly 100 may include one or more fasteners including a first fastener 102A and a second fastener 102B, one or more flex joints including a first flex joint 104A and a second flex joint 104B, and one or more spacing mechanism 106. The configurable panel 112 may be attached to the door 114 with one or more fastener assemblies. The one or more spacing mechanisms 106 may be a single spacing mechanism at variable lengths illustrated by the distance break 120. For example, a fastener assembly 100 may attach a configurable panel to a door by fastening a first fastener 102A to a first flex joint 104A, and the first flex joint 104A may be fastened to a spacing mechanism 106. The door 114 may be fastened to the spacing mechanism 106 by a second fastener 102B to a second flex joint 104B, and the second flex joint 104B may be attached to the spacing mechanism 106.

Figure 1B:
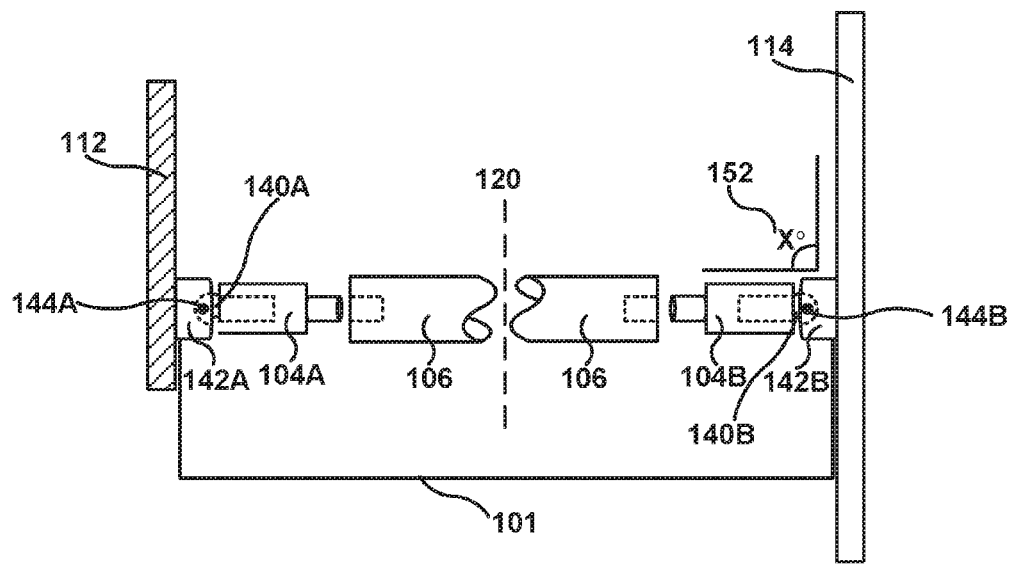
FIG. 1B depicts a configurable door panel cover being fastened to a door panel of an enclosure with ball joints, according to embodiments of the present disclosure.

FIG. 1B depicts a configurable panel being fastened to a door of an enclosure with ball joints, according to embodiments. A configurable panel 112 is attached to the door 114 of an enclosure with a ball joint fastener system at one or more attachment points. The ball joint fastener assembly 101 may include one or more ball joint receptors including a first ball joint receptor 142A and a second ball joint receptor 142B, one or more ball joints including a first ball joint 140A and a second ball joint 140B, one or more setscrews including a first setscrew 144A and a second set screw 144B, one or more flex joints including a first flex joint 104A and a second flex joint 104B, and one or more spacing mechanisms 106.

A configurable panel 112 may be attached to the door 114 with one or more ball joint fastener assemblies. The one or more spacing mechanisms 106 may be a single spacing mechanism at variable distances illustrated by the distance break 120. For example, a ball joint fastener assembly 101 may attach a configurable panel to a door by attaching a first ball joint 140A to a first flex joint 104A. The first ball joint 140A is set into a first ball joint receptor 142A and held in place by a first setscrew 144A. The first flex joint 104A may be fastened to a spacing mechanism 106A. The door 114 may be fastened to the spacing mechanism 106 by attaching a second ball joint 140B to a second flex joint 104B. The second ball joint 140B is set into a second ball joint receptor 142B and held in place by a second setscrew 144B. The second flex joint 104B may be attached to the spacing mechanism 106.

The ball joint 140 may rotate on a on the joint at an angle X° 152 to the first face of the door 114 of the enclosure the rotation of the ball joint 140 may be determined by the size of the ball joint and the size of the ball joint receptor 142. For example, a ball joint of 0.5 inches in diameter with a ball joint receptor of 0.25 inches in height may allow for the ball joint to rotate 60° from a perpendicular orientation between the first face of the door and the spacing mechanism.

The fastener 102 or ball joint 140 may be a mechanical means of attachment to attach one or more configurable panel 112 to the door 114 of the enclosure. The fastener 102 may include a screw or bolt that includes a threaded rod that may be attached to the flex joint 104 or spacing mechanism 106. The ball joint may be set into the ball joint receptor 142. The ball joint receptor 142 may include a setscrew 144 that may be set to allow the ball joint 140 to rotate freely, the setscrew 144 may be set to hold the ball 140 joint in place, or anywhere between. The rotation of the ball joint 140 may be adjusted to allow more or less degrees of freedom based on the size of the ball joint or the space allowed between the ball joint receptor and the flex joint. An orientation of the configurable panel 112 may be rotated or tilted on an axis that is parallel to a first face of the door 114 of the enclosure, when rotated the configurable panel 112 may be askew to the parallel plane of the first face of the door 114. The orientation of the configurable panel 112 will be described further herein.

The flex joint 104 of the fastener assembly 100 may be a malleable attachment that attaches the fastener 102 to the spacing mechanism 106. The flex joint 104 may be constructed from materials including rubber, plastics, or other flexible materials. The flex joint 104 may be flexible allowing for a range of movement of the fastener assembly 100. The flex joint 104 may dampen the transfer of vibrations generated by the enclosure from propagating to the configurable panel. The flex joint 104 may be removed from the fastener assembly 100 and the fastener 102 may be attached directly to the spacing mechanism 106, or the configurable panel may be attached directly to the door of the enclosure 114. The spacing mechanism 106 will be described further herein.

The fastener assembly 100 may be adjusted within the perpendicular plane to the door 112 of the enclosure. A fastener assembly 100 including a spacing mechanism 106 may be rotated in a perpendicular plane or askew to the perpendicular plane to the configurable panel 112. By rotating the fastener assembly 100, the configurable panel 112 may be adjusted parallel or askew the same or similarly to the adjustment of the fastener assembly 100 to the door of the enclosure 114 in 360°. For example, by rotating the fastener assembly 15° counter-clockwise the configurable panel may be also rotated 15° counter-clockwise to the door of the enclosure.

In various embodiments, a fastener assembly 101 may include a ball joint and a fastener as attachment points. The fastener assembly 101 may include attaching the configurable panel to the door. Either the door or the configurable panel may include a fastener or a ball joint. For example, the configurable panel may include a ball joint fastener, and the door may include a fastener.

In various embodiments, the ball joint 140A may be a snap in place fastener that snaps into place in a snap joint similar to the ball joint receptor 142A as part of the fastener assembly 100. The snap in place fastener may be attached to the snap joint by lining up the snap in place fastener and the snap joint and exerting a force to attach the snap in place fastener to the snap joint. The snap in place fastener may allow for quick removal, addition, or substitution of configurable panels. The snap in place faster may also allow the panels to be adjusted without opening the door of the enclosure.

In various embodiments, the fastener 102 may be a stand-off that is fastened on the outside of the configurable panel. The stand-off may include a spacing mechanism 106 at a fixed length that is attached to a fastener 102 on the outside of the configurable panel 112. For example, a first configurable panel 112 may be detached (removed) and replaced by unscrewing the fasteners 102 positioning a second configurable panel 112 and reattaching the fasteners.

Figure 2:
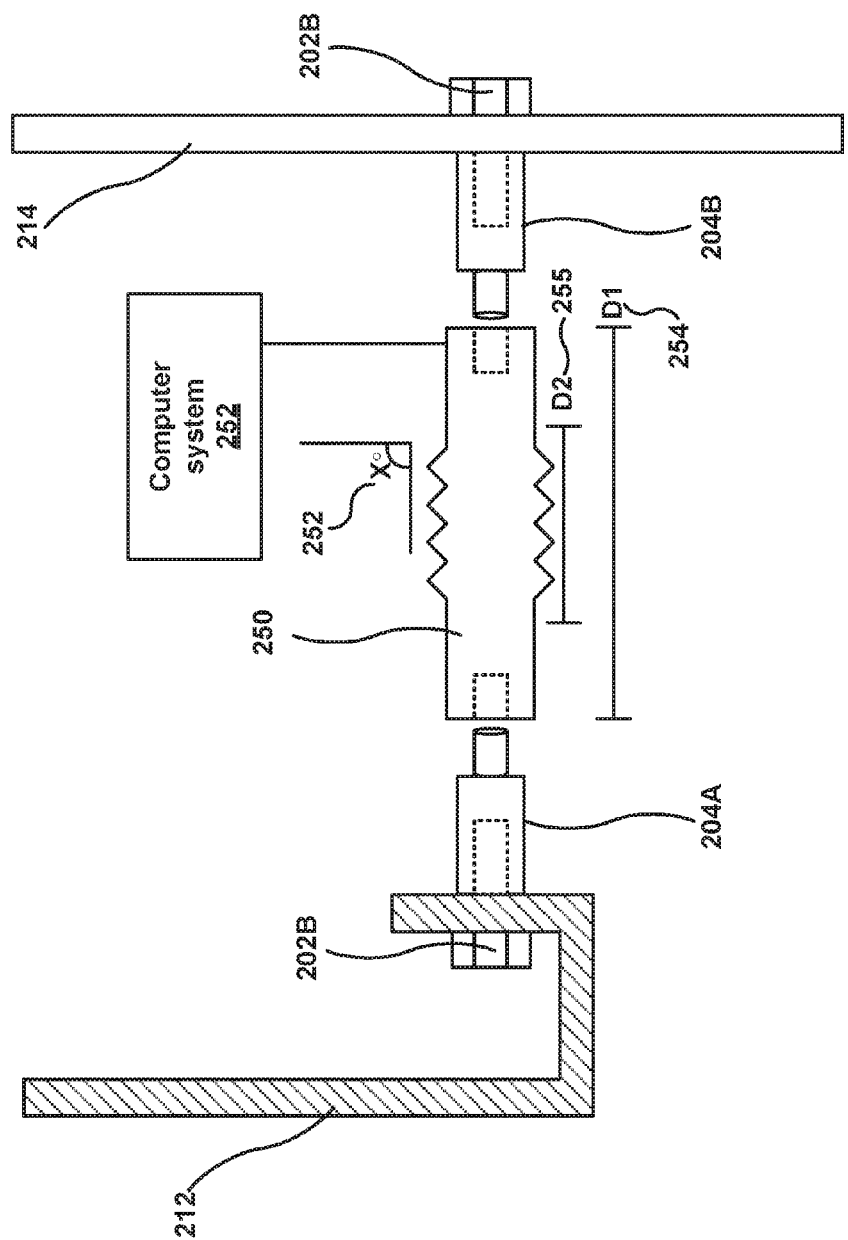
FIG. 2 depicts a configurable door panel cover being fastened to a door panel of an enclosure with an actuator for increasing or decreasing the distance between the door panel and the enclosure, according to embodiments of the present disclosure.

FIG. 2 depicts a configurable panel being fastened to a door of an enclosure with an actuator for increasing D2 255 to D1 254 or decreasing D1 to D2 the distance between the configurable panel and the door of the enclosure, according to embodiments. A configurable panel 212 may be fastened to the door 214 with a fastener assembly that includes an actuator 250. The actuator 250 may be attached to the configurable panel 212 with a first flex joint 204A that is fastened to the configurable panel 212 with a first fastener 202A. The actuator 250 may be attached to the door 214 with a second flex joint 204B that is fastened to the door 214 with a second fastener 202B.

The actuator 250 may be communicatively coupled with a computer system 252. The actuator 250 may receive instructions from the computer system 252 for setting an orientation and/or a distance of the configurable panel 212 to the door 214 of the enclosure. The computer system 252 may control one or more actuators that are within one or more fastener assemblies attaching one or more configurable panels to one or more doors of enclosures. For example, the computer system 212 may determine that the distance between the configurable panel 212 and the door 214 should be 3 inches. The computer system 252 may then instruct the actuator 250 to extend until the distance between the configurable panel 212 and the door 214 is, e.g. 3 inches. The computer system 252 may receive an input from a user that may instruct the actuator 250 to alter the configurable panel 212. For example, a user may input a change in distance between the configurable panel 212 and door 214 to be, e.g. 2 inches. The computer system may then instruct the actuator 250 to make the distance 2 inches.

The actuator 250 may function as an adjustable length spacing mechanism. When using a spacing mechanism the distance between the configurable panel 212 and the door 214 may be altered by changing the spacing mechanism to a second spacing mechanism that is longer or shorter than the first spacing mechanism. The actuator 250 may be instructed to change the distance between the configurable panel and the door from D1 254 to D2 255. For example, an actuator 250 may be instructed to change a distance from 2 inches to 3 inches. Upon the reception of the instructions, the actuator 250 may increase the distance between the configurable door panel 212 and the door 214 to 3 inches.

The actuator 250 may alter the orientation of the configurable panel by tilting the configurable panel at an angle X° 252 such that a first edge of the configurable panel 212 is closer to the door than a second edge. One or more actuators 250 may fasten the configurable panel 212 to the door 214. The actuation of one or more actuators 250 may cause the configurable panel to be askew to the first face of the door 214 at an angle X° 252. For example, two actuators 250 may attach the configurable panel 212 to the door 214 inches parallel. A first actuator on a first side may decrease the distance from D1 254 to D2 255 between the configurable panel 212 and the door 214 on the first side, and a second actuator on a second side may remain at the same length. The result of the distance of the first side increasing, and the second side staying the same may result in the configurable panel 212 being askew to the first face of the door 214. A single actuator may be able to alter the orientation by including a tilting mechanism. The actuator may include a hinge that may allow the actuator to tilt at an angle X° 252 to the configurable panel 212. For example, an actuator may include a tilting mechanism. A computer system 252 may instruct the actuator 250 to tilt 5° in a downward direction.

In various embodiments, the fasteners 202 may be replaced with ball joints. The actuator may be attached to the configurable panel 212 and/or the door 214 with ball joints. The ball joints may be controlled by the computer system 252 to alter their orientation based on instructions from the computer system 252. For example, a ball joint may receive an instruction to alter the orientation of the configurable panel of a 3° change tilting in a downward direction.

Figure 3:
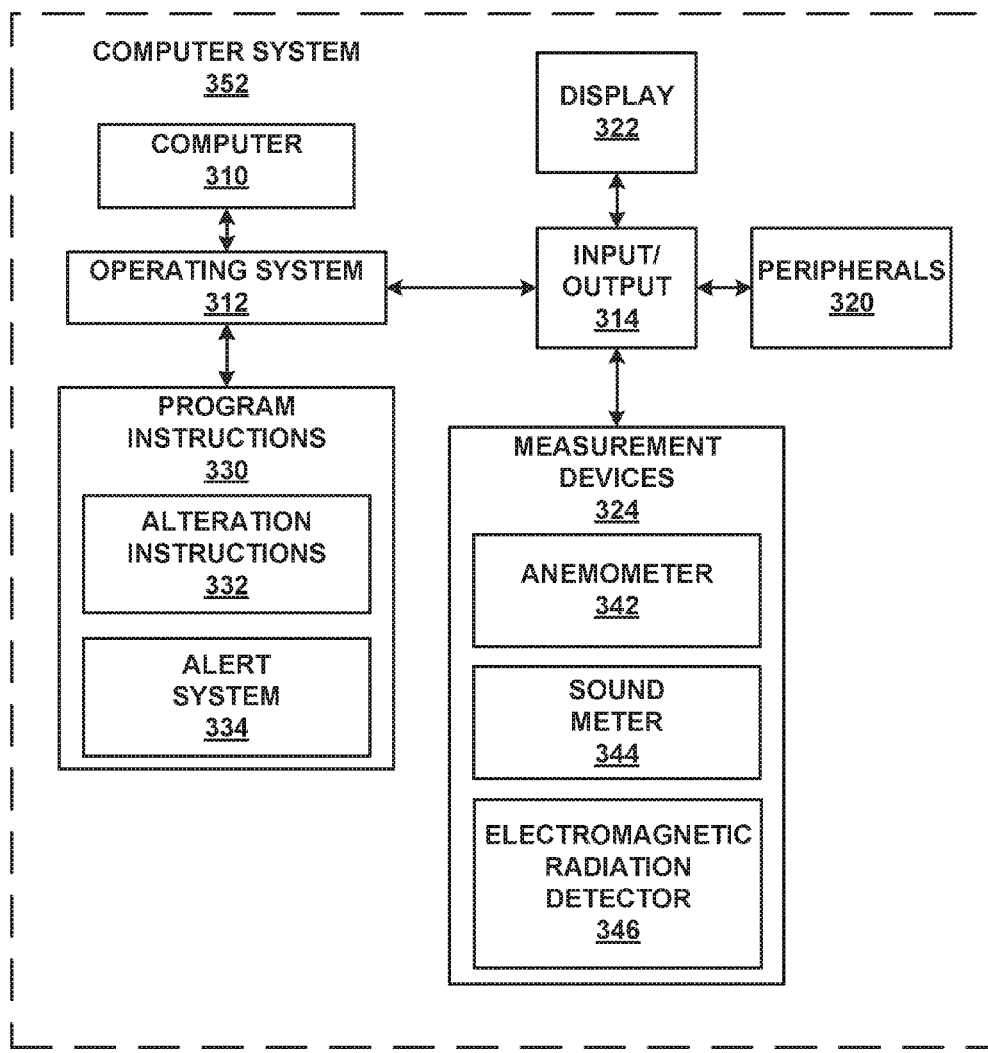
FIG. 3 depicts a computer system that includes one or more measurement devices, according to embodiments.

FIG. 3 depicts a computer system that may include one or more measurement devices, according to embodiments. A computer system 352 may include computing components. The computing components may include an operating system 312, an input/output 314, and program instructions 330. The input/output may connect the computer 310 to one or more peripherals 320, a display 322, and one or more measuring devices 324. The peripherals 320 may include a keyboard or a mouse that a user may operate to preform actions on the computer 310 of the computer system 352 through the operating system 312. The display 322 may display the operating system 312 of the computer 310. The measurement devices 324 may include an anemometer 342, a sound meter 344, and/or an electromagnetic radiation (EMR) detector 346. The measurement devices 324 may communicate with the computer 310 through the operating system 312 based on measurements of the environmental factors of the enclosure.

The program instructions 330 may receive the measurements of the environmental factors from the measurement devices 324 and inform a user or instruct an actuator to alter an orientation of a configurable panel. The program instructions 330 may include alteration instructions 332 and an alert system 334. The alteration instructions 332 may include instructions to alter an orientation of a configurable panel. The alteration instructions 332 may be sent to the actuator to instruct the actuator to alter the orientation of the configurable panel. The alteration instructions 332 may also be displayed to a user on the display 322, which may instruct the user to alter the orientation of the configurable panel. The alert system 334 may be used to issue an alert to a user or an actuator based on the measurement of the environmental factors by the measurement devices 324 to have reached a threshold. Thresholds of the environmental factors will be described further herein.

Measurement devices 324 may include a device for measuring the airflow, measuring the sound pressure, and/or measuring the electromagnetic radiation. The airflow may be measured within the enclosure. The measurement devices 324 may be used to determine if the orientation of the configurable panels may be optimized to increase airflow, decrease the emitted sound pressure, and/or decrease the emitted electromagnetic radiation. The measurement devices 324 may communicate with the computer 310 of the computer system 352 through the operating system 312. The program instructions 330 of the computer system 352 may then inform the user to change the orientation of the configurable panels.

The airflow may be measured by a device such as an anemometer 342, which measures the force or speed of the airflow. The airflow within the enclosure may be compared to a threshold of the airflow. If the force of the airflow that is measure reaches or falls below the threshold of the airflow, the computer system 352 may alter the orientation of the configurable panels or inform the user to alter the orientation of the configurable panels. For example, the measurement deceve 324 may be an anemometer 342 to measure the force of the airflow, and the threshold of the airflow may be set at 1 meter per second (m/s). If the anemometer measures the airflow to be 0.95 m/s, then the force of the airflow may be insufficient and the computer system 352 may inform the user to change the orientation of the configurable panels. For example, the changing of the orientation of the configurable panels may include increasing the distance from door of the enclosure to the configurable panel by increasing the length of the spacing mechanisms.

The sound pressure may be measured by a device such as a sound meter 344, which measures the force of the sound pressure. The sound pressure may be measured in decibels (dB). The sound pressure may be measured outside the enclosure at a location a set distance from the enclosure. If the sound pressure reaches or is above the threshold of the sound pressure, then the computer system 352 may alter the configurable panels or inform the user to alter the orientation of the configurable panels. For example, the measurement device 324 may be a sound meter 344 to measure the force of the sound pressure, and the threshold may be set at 90 dB. If the sound meter measures the sound pressure to be 93 dB at a location of 3 feet (ft) away from the front of the enclosure 2 feet off the ground, then the force of the sound pressure may be above the threshold at the location. The computer system 352 may then alert the user to change the orientation of the configurable panels. For example, the changing of the orientation may include decreasing the distance from the door of the enclosure to the configurable panel by decreasing the length of the spacing mechanisms.

The electromagnetic radiation (frequency) flux may be measured by an electromagnetic field (EMF) or an electromagnetic radiation (EMR) detector 346. The EMF may be measured outside the enclosure at a set distance from the enclosure. If the EMF reaches or is above the threshold of the EMF emissions, then the computer system 352 may alter the configurable panels or inform the user to alter the orientation of the configurable panels. For example, the measurement device 324 may be the EMR 346 detector and the EMF threshold may be set at 2 milligauss (mG). If the EMF detector determines that the EMF is 2.2 mG at a distance of 3 ft from the enclosure, then the EMF emissions may be at or above the threshold. The computer system 352 may alert the user to change the orientation of the configurable panels. For example, changing the orientation may include substituting the current configurable panel for a second configurable panel that has a higher EMF reflection rating.

In various embodiments, the computer system 352 may be stored within the enclosure. The computer system 352 may include measurement devices that are attached or the computer system 352 may receive inputs from the user based on readings using external devices. For example, the user may operate a sound meter that plugs into the computer system 352 inside the enclosure if the sound meter determines that the sound level is at or above the threshold then the computer system 352 may alter the configurable panels or inform the user to alter the configurable panels.

In various embodiments, the computer system 352 may be a stand-alone device that a user may operate inside or outside the enclosure to determine if the orientation of the configurable panels requires altering. The device may include one or more of the measurement devices 324 that the user may position based on the reading they are looking for. The user may position the device inside the enclosure to determine the airflow within the enclosure. For example, the user may operate an airflow measurement device 342 such as an anemometer 342 within the device by placing the measurement device within the enclosure if the anemometer 342 determines that the airflow is at or below the threshold then the program instructions 330 may send alteration instructions 332. The alteration instructions 332 may instruct a user on a display 322 informing a user to alter the configurable panels or to an actuator informing the actuator to alter the configurable panels and a desired orientation of the configurable panels.

Figure 4:
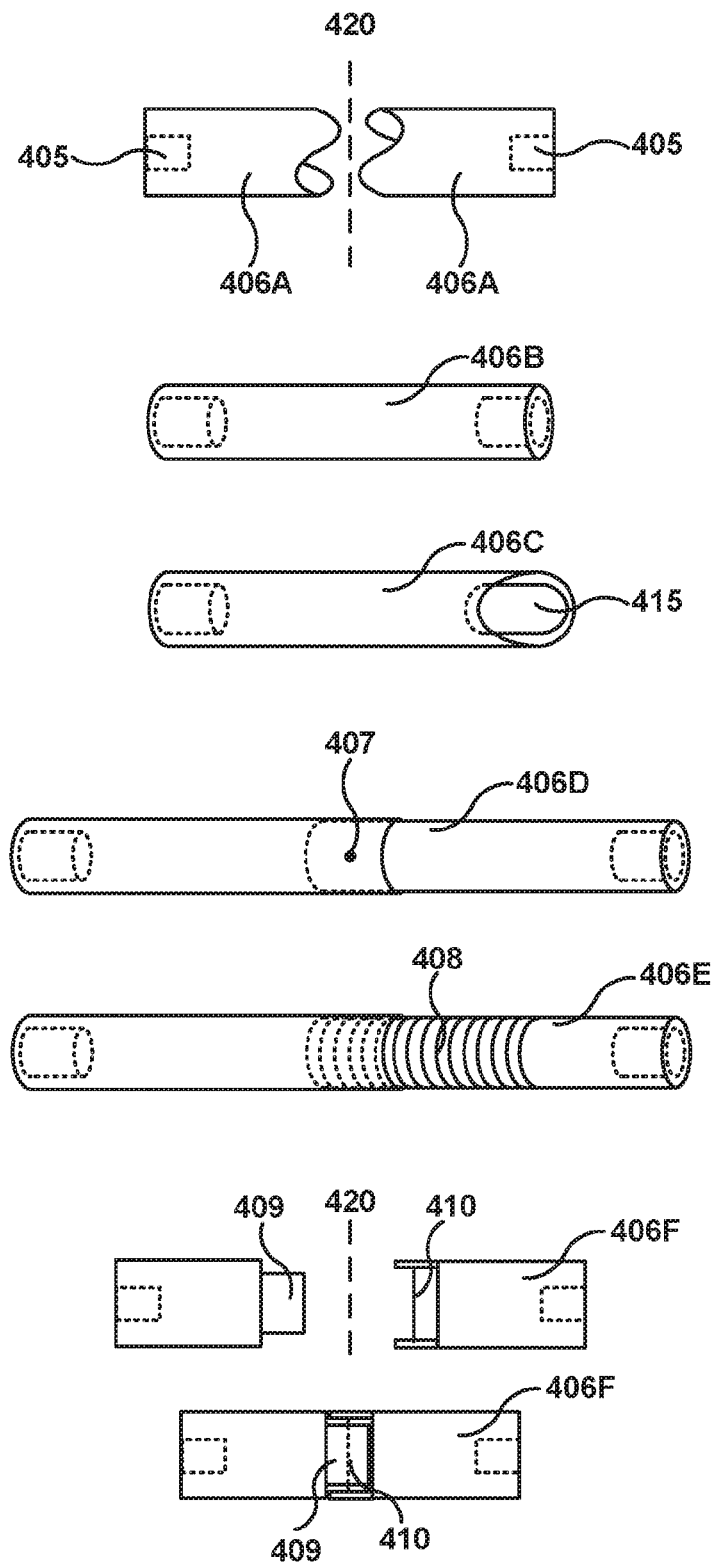
FIG. 4 depicts multiple variations of spacing mechanisms, according to embodiments of the present disclosure.

FIG. 4 depicts multiple variations of spacing mechanisms (spacers), according to embodiments. The spacers 406A-F may be constructed of various materials. The lengths of the spacers may be increased or decreased in depending on needs of the spacer. The spacers 406A-F illustrate various example spacers that may be used to control the distance and angles that the configurable panels may be attached to the door of the enclosure.

Spacer 406A depicts a spacer. The spacer 406A may be various lengths that may be illustrated by a distance break 420 in spacer 406A and spacer 406F depending on the configuration of the spacer. The spacer 406 may include attachment points 405, which may be used to attach the spacer to a fastener assembly.

Spacer 406B depicts a set length spacer 406B. The set length spacer 406B may be a length of a predetermined distance. During the altering of the orientation or distance of a configurable panel, the set length spacer 406B may be replaced for another set length spacer of a second predetermined distance. For example, a first spacer of 2 inches may be removed and substituted for a second spacer of 3 inches.

Spacer 406C depicts a spacer with an angled attachment point. The angled spacer 406C may be a length of a predetermined distance and include at least one angled attachment point 415. During the altering of the orientation of the configurable panel may include fastening the panel at an angle at the angled attachment point 415. For example, a spacer may be attached at an angle askew to the door of the enclosure with the angled spacer 406C. If the angle of the angled attachment point 415 of the angled spacer 406C is a 45° angle then the configurable panel may be attached to the door at a 45° angle.

Spacer 406D depicts a spacer with two sliding pieces fastened together with a setscrew. The spacer 406D may include two sliding pieces with a setscrew 407 to hold the two pieces in place. The sliding spacer 406D may include a range of lengths. For example, a sliding spacer 406D may be extendable from 2 inches to 3.5 inches. In an additional example, a sliding spacer 406D may be extendable from 4 inches to 8 inches.

Spacer 406E depicts a spacer with a threaded piece and a thread receptive piece. The threaded spacer 406E may include two pieces one of which is threaded and another which is configured to receive the threaded end. The threaded spacer 406E may include threads 408, which may be used to increase or decrease the length of the spacer 406E. For example, the threaded spacer may be extendable from 3 inches to 6 inches. In an additional example, a sliding spacer 406E may be extendable from 6 inches to 9 inches.

Spacer 406F depicts a spacer with a hinge mechanism. The hinged spacer 406F may be used to alter the orientation of the configurable panel. The hinge mechanism may include a pin receptor 409 and a pin 410 that may connect a first end to a second end of the hinged spacer 406F. For example, the hinged spacer 406F may include a first end attached to the configurable panel, and the second end attached to the door. The configurable panel may be adjusted such that the orientation of the configurable panel is askew to the first face of the door. To alter the orientation of the configurable panel in any direction the tilting angle of the hinged spacer 406F may be turned 360° to perpendicular to the first face of the door. For example, the hinged spacer 406F may attach the configurable panel to the door. The hinged spacer 406F may be tilted such that the configurable panel is askew to the door of the enclosure.

The spacing mechanisms may be constructed or set to various heights to have control over the distance between the configurable panel and the door, and the orientation at which the configurable panel is to the first face of the door. For example, an enclosure may require an increased airflow. A distance between a configurable panel and a door of the enclosure may be increased by increasing the length of the spacing mechanism such that the enclosure receives an increased airflow.

In various embodiments, one or more different spacers 406A-F may be combined or used together to attach a configurable panel to the door of the enclosure. For example, the enclosure may include a sliding spacing mechanism 406C and a hinged spacing mechanism 406E. The use of one or more different spacing mechanisms 406A-F may allow for multiple orientations of the configurable panels based on the needs of the server.

Figure 5:
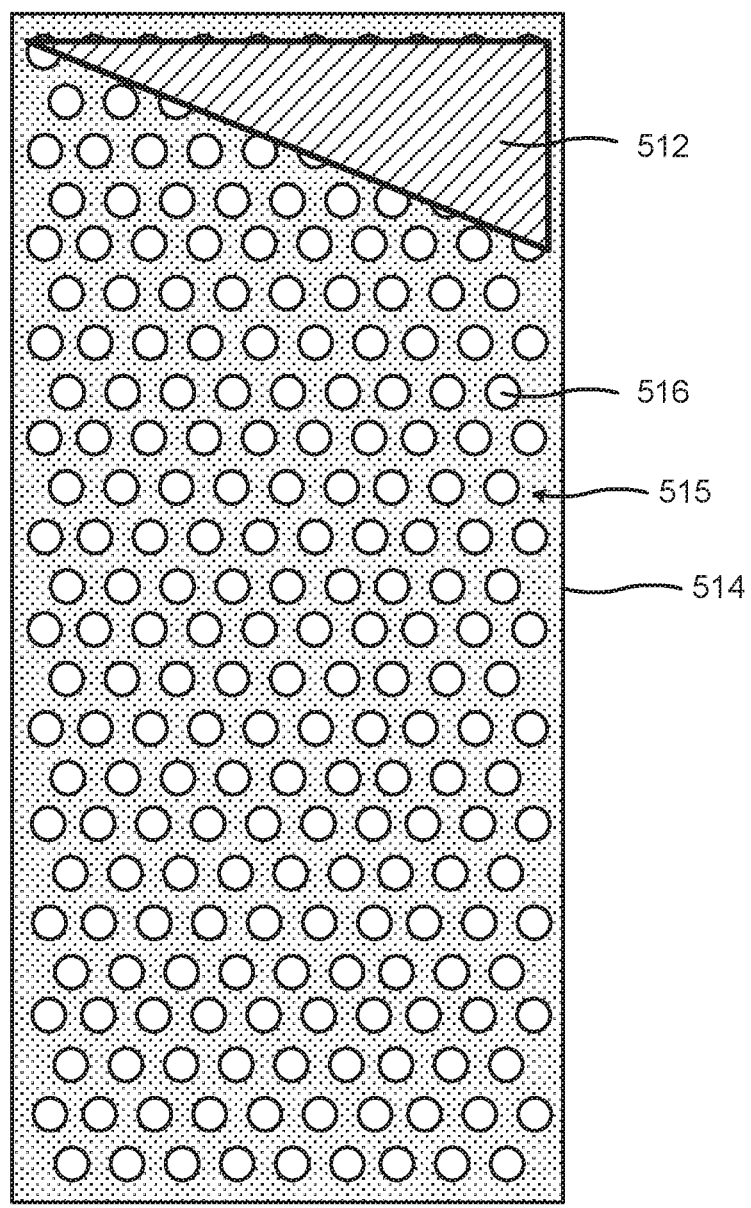
FIG. 5 depicts a configurable door panel cover attached to a perforated door panel of an enclosure, according to embodiments of the present disclosure.

FIG. 5 depicts a configurable panel attached to a perforated door panel of an enclosure, according to embodiments. A configurable panel 512 may be attached to the first face 515 of the door 514 of an enclosure. The door 514 may include a plurality of perforations 516 that may allow airflow to enter a cavity of the enclosure. The configurable panel 512 may be attached to the first face 515 of the door 514 outside the cavity of the enclosure. The configurable panel 512 may be attached to the first face 515 of the door 514 with one or more attachment points on the door. The one or more attachment points may be the perforations 516 of the door 514.

The configurable panel 512 may cover one or more of the perforations 516 of the door 514. The perforations 516 that are covered may bring in less airflow than perforations 516 that are not covered. For example, a first configurable panel 512 may restrict airflow to 20 different perorations 516. If the configurable panel 512 was oriented such that the configurable panel 512 only restricted airflow to 15 perforations 516, then the airflow may increase within the enclosure. The perforations 516 that are uncovered may allow for a higher sound pressure outputted from the door 514 of the enclosure depending on the size of the perforations 516 and the orientation of the configurable panels 512. For example, a configurable panel may be oriented such that the configurable panel covers 15 perforations 516. The configurable panel 512 may be reoriented such that the configurable panel 512 covers 20 perforations 516 that may reduce the sound pressure that is emitted from the enclosure.

The configurable panel 512 may be detached from the door 514 by detaching one or more fastener assemblies that may connect the configurable panel 512 to the door 514. The configurable panel 512 may be repositioned by reattaching the configurable panel 512 to the door 514 inches a second location and/or orientation. For example, the configurable panel 512 may be attached to the door 514 such that the longest end of the configurable panel 512 is parallel to the ground. The configurable panel 512 may then be detached and reattached to the door 514 such that the longest end of the configurable panel 512 is perpendicular to the ground. In an additional example, the configurable panel 512 may be reattached such that it is askew at a determined angle to the ground.

Figure 6:
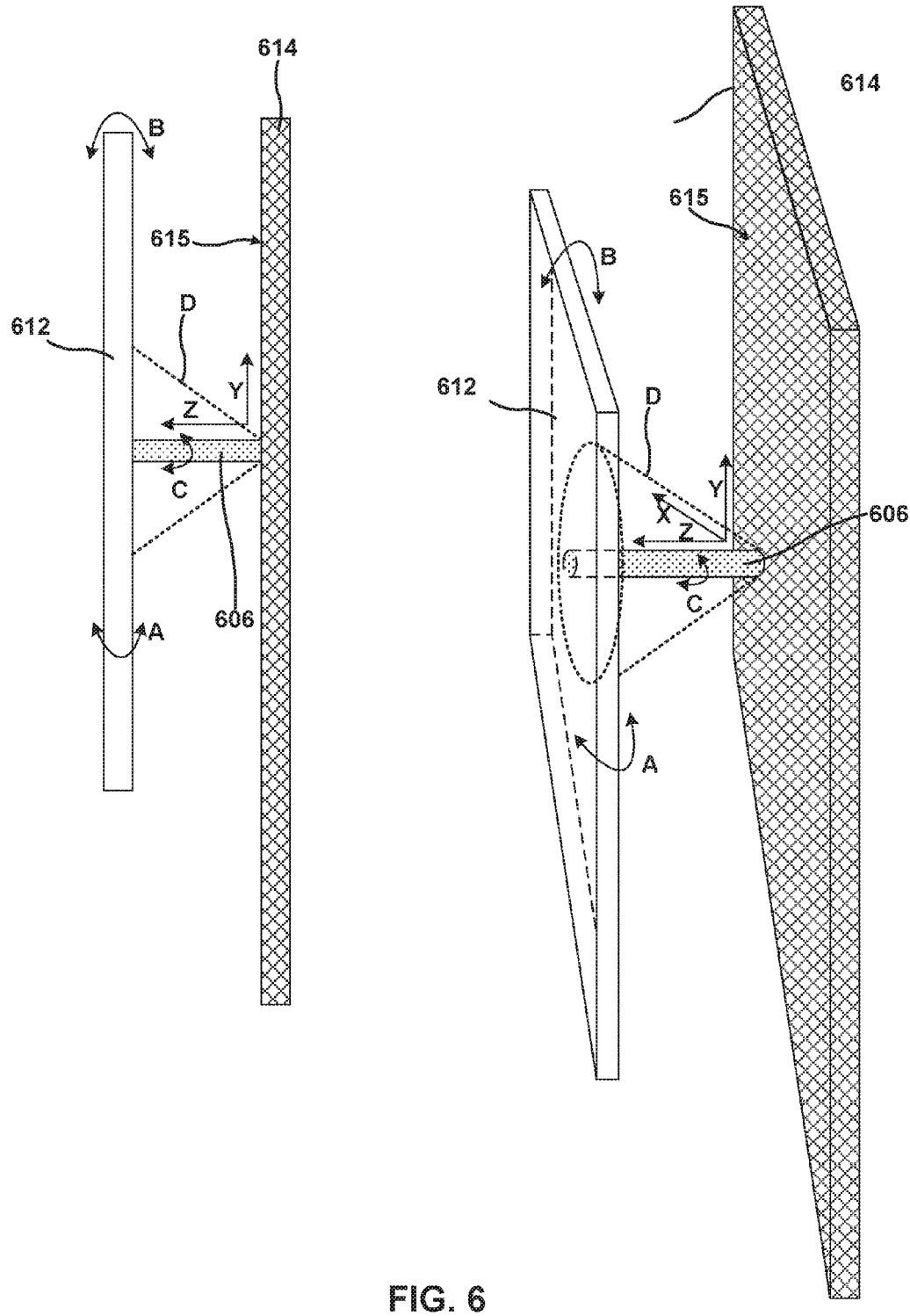
FIG. 6 depicts a side view and a three-dimensional view of a configurable door panel configured to change an orientation on an axis in a plane in front of a door of the enclosure, according to embodiments of the present disclosure.

FIG. 6 depicts a configurable panel configured to change an orientation on an axis in the plane of the first face of a door of an enclosure, according to embodiments. A two-dimensional (2D) drawing and a 3D drawing are illustrated to portray the movement and orientation of the configurable panel 612.

The configurable panel 612 may be moved along the first face 615 of the door 614 of the enclosure. The movement of the configurable panel on the first face 615 may be illustrated by the X-axis and Y-axis of the first face 615 of the door 614. Movement in the X-axis may be movement in the X-direction. Movement in the Y-axis may be movement in the Y-direction. The configurable panel 612 may be moved along the first face 615 of the door 614 to alter a location of the configurable panel. For example, a location of a configurable panel 612 may be altered by moving the configurable panel 2 inches in the positive Y-direction and 3 inches in the positive X-direction to move a center of the configurable panel 3.6 inches away from the original starting location.

In various embodiments, the fastener assembly 606 may be attached to a sliding rail (not pictured). The sliding rail may allow the fastener assembly 606 to be adjusted to a second location on the door 614. In response to altering the location of the fastener assembly 606 on the sliding rail the configurable panel 612 may be altered to a second location. The sliding rail may be attached to the configurable panel 612 and/or the first face 615 of the door 614. A sliding rail may be attached to both the configurable panel 612 inches the Y-axis direction and the door 614 inches the X-axis direction to alter the location of the panel in both the X-axis and the Y-axis. For example, the configurable panel 612 may include a sliding rail in the direction of the Y-axis, and the door 614 may include a sliding rail in the direction of the X-axis. The location of the configurable panel 612 may be altered 4 inches vertically (Y-axis) and 3 inches laterally (X-axis) to move a center of the configurable panel 5 inches away from the original starting location.

The configurable panel 612 mat be moved closer to or further away from the first face 615 of the door 614. The distance the configurable panel 612 is away from the first face 615 of the door 614 may be illustrated by the Z-axis. The distance (Z-axis) may be increased by altering the fastener assembly 606. For example, a spacing mechanism of the fastener assembly 606 may be increased or substituted for a longer second spacing mechanism to increase the distance between the configurable panel 612 and the first face 615 of the door 614 of the enclosure. The distance (Z-axis) may be increased with a fastener assembly 606 including an actuator. The actuator may be instructed to increase or decrease the distance between the configurable panel 612 and the first face 615 of the door 614. For example, an actuator of a fastener assembly 606 may be instructed to increase the distance between the configurable panel 612 and the first face 615 of the door 614. The actuator may be instructed to increase the distance from 2 inches to 3 inches.

The configurable panel 612 may be oriented such that the configurable panel 612 is askew to the first face 615 of the door 614. The configurable panel 612 may be askew when the configurable panel 612 is non-parallel to the first face 615. The configurable panel 612 may be oriented by tilting (angling) the orientation of the configurable panel 612 on the fastener assembly 606 inches the A-rotation, or the B-rotation. The A-rotation may angle the configurable panel 612 inches the latitudinal direction on the longitudinal axis. The B-rotation may angle the configurable panel 612 inches the longitudinal direction on the latitudinal axis. For example, a configurable panel 612 may be tilted at a 5° angle in the latitudinal direction on the longitudinal axis. The configurable panel 612 may then be tilted at a 5° angle in the A-rotation.

The configurable panel 612 may be tiled on the longitudinal axis in the A-rotation or on the latitudinal axis in the B-rotation by using an angled spacer 606. The angled spacer 606 may connect to the configurable panel 612 within the cone D. The configurable plane may be tilted on the perpendicular axis within the cone D in the A-rotation, B-rotation, or both until the configurable panel comes in contact with the door 614. For example, by attaching the angled spacer 606 to a location on the configurable panel 612 lower on cone D the top of the configurable panel 612 may be tilted toward the door 614 in the B-rotation. In another example, by attaching the angled spacer 606 to a location on the configurable panel 612 to the right on cone D the left side of the configurable panel 612 may be tilted toward the door 614 in the A-rotation.

In various embodiments, the tilting of the orientation of the panel may include a fastener assembly 606 with an actuator including a tilt mechanism. The actuator may be instructed to tilt the configurable panel 612 to an angle. The actuator may be instructed by a computer system to determine the direction and amount of the angle of the configurable panel. For example, the actuator may receive instructions from a computer system to tilt the panel at a 2.5° angle in the longitudinal direction on the latitudinal axis. The actuator may then tilt the configurable panel at the 2.5° angle in the B-rotation.

In various embodiments, the tilting of the orientation of the panel may include a fastener assembly 606 with a hinged spacing mechanism configured to tilt the configurable panel. The hinged spacing mechanism of the fastener assembly 606 may be adjusted by a user to tilt in a direction based on the hinge and the direction of tilt. For example, the hinge may be oriented such that the configurable panel 612 may be tilted in the longitudinal direction on the latitudinal axis. The hinge may be then tilt the configurable panel at a 3° angle in the B-rotation.

In various embodiments, the tilting of the orientation of the panel may include a fastener assembly 606 with a ball joint as a fastener. The configurable panel 612 may be tilted on the ball joint and the ball joint may be fastened with a setscrew to tilt the configurable panel 612 askew to the first face 615 of the door 614. For example, the configurable panel 612 may be tilted at a 3° angle in the B-rotation, an 8° angle in the A-rotation, and the ball joint may then be fastened in place with the setscrew.

In various embodiments, the tilting of the orientation of the panel may include a fastener assembly 606 that attaches the configurable panel at an angle. The fastener assembly 606 may include an angled spacing mechanism. The fastener assembly 606 may include an angled washer or flex joint configured to alter the angle of the panel during attachment. For example, the configurable panel 612 may be attached to a 5° angled spacing mechanism, which holds the configurable panel 612 at a 5° angle to the spacing mechanism.

The configurable panel 612 may be turned (rotated) such that the configurable panel 612 is rotated with respect to the first face 615 of the door 614. By turning the configurable panel 612 inches the C-rotation, the configurable panel 612 may be rotated with respect to the original location of the configurable panel 612. The configurable panel 612 may be rotated clockwise or counterclockwise. For example, the configurable panel may be manually rotated or receive instructions to rotate the panel in the C-rotation direction. For example, the configurable panel may receive instructions to rotate an angle 15° counter clockwise.

Figure 7A:
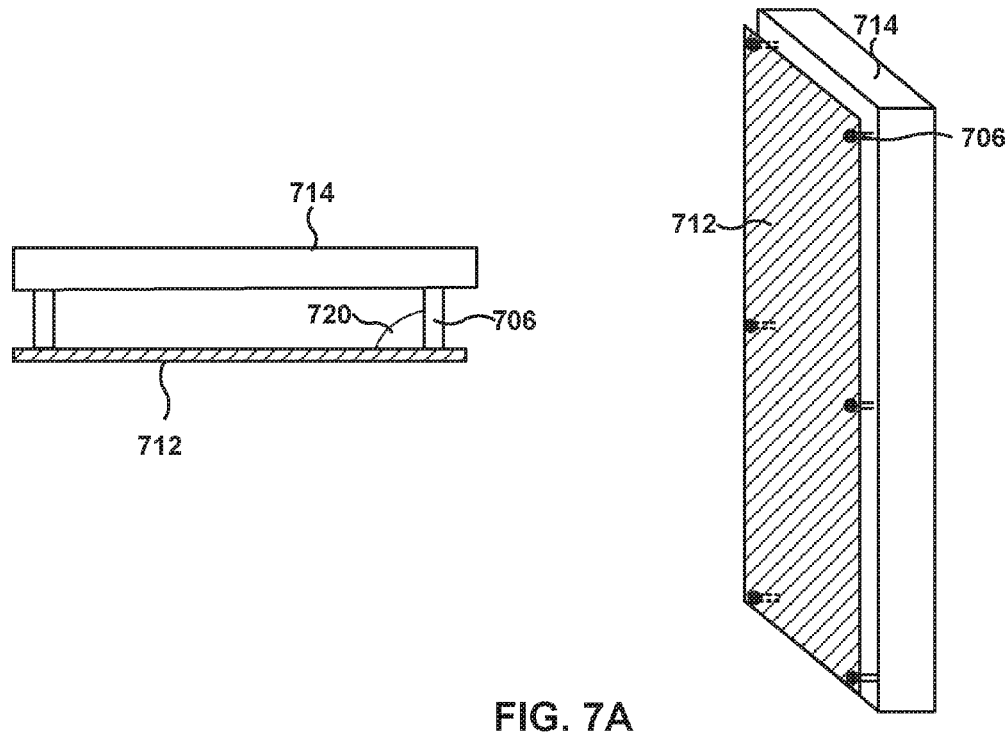
FIG. 7A depicts a top view and a three-dimensional view of a configurable door panel cover attached to a door panel of an enclosure parallel to the door panel, according to embodiments of the present disclosure.

FIG. 7A depicts a configurable panel attached to a door of an enclosure parallel to the panel, according to embodiments of the present disclosure. A 2D and a 3D drawing are illustrated to portray the movement and orientation of the configurable panel 712. The configurable panel 712 may be attached to a door 714 with one or more fastener assemblies 706. The fastener assemblies 706 may include fixed length spacing mechanisms, configurable spacing mechanisms, or actuators. The fastener assemblies 706 may attach the configurable panel 712 to the door 714 such that the configurable panel is parallel and a first angle between the fastener assembly 706 and the configurable panel 712 is at an angle 720 of 90°.

Figure 7B:
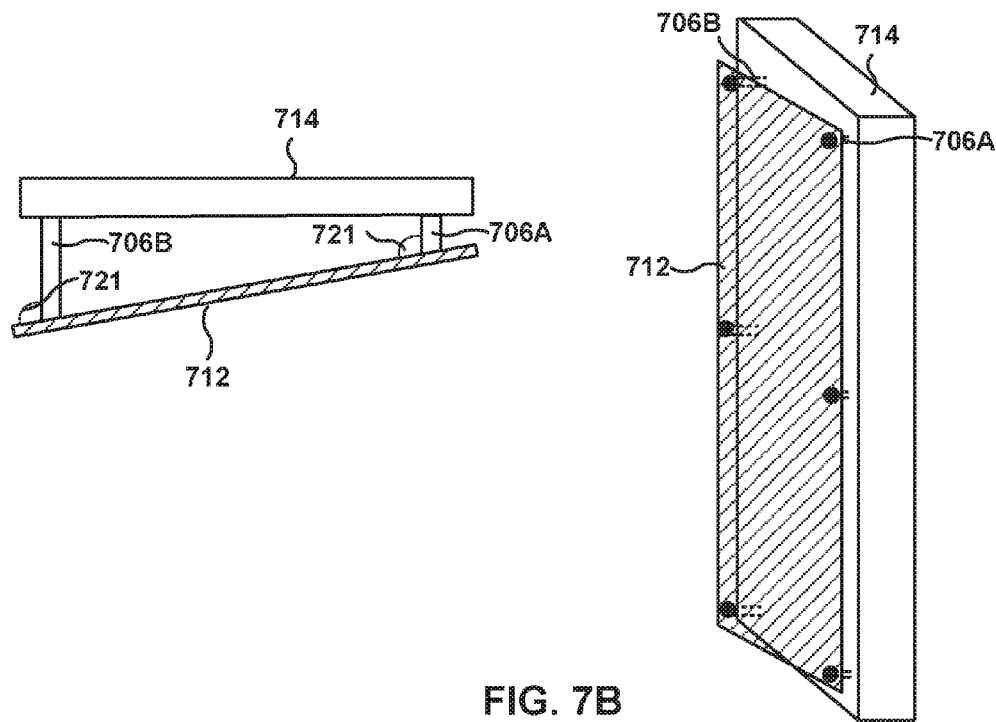
FIG. 7B depicts a top view and a three-dimensional view of a configurable door panel cover attached to a door panel of an enclosure askew to the door panel, according to embodiments of the present disclosure.

FIG. 7B depicts a configurable door panel cover attached to a door panel of an enclosure askew to the door panel, according to embodiments. The configurable panel 712 may be attached to a door 714 with one or more fastener assemblies 706. The fastener assemblies may include a first fastener assembly 706A of a first length and a second fastener assembly 706B of a second length. The fastener assemblies 706 may include fixed length spacing mechanisms, configurable spacing mechanisms, or actuators. The attachment of the first fastener assembly 706A and second fastener assembly 706B may cause the configurable panel 712 to be askew with the door 714. The first fastener assembly 706A and the second fastener assembly 706B may attach the configurable panel 712 to the door 714 such that the configurable panel is askew. The askew orientation of the configurable panel 712 may result in a second angle 721 between the first fastener assembly 706A and the configurable panel 712 at an angle of greater than 90°. For example, the angle between the first fastener assembly 706A and the configurable panel may be 104°.

If the spacers 706 are identical lengths, the configurable panel 712 may be at an orientation parallel to the door 714. The spacers 706 may be included in a fastener assembly. An identical length may include two spacers that are exactly the same lengths. The spacers 706 may be spacing mechanisms. If the configurable panel 712 is parallel to the door 714, then the angle 720 between the configurable panel and the spacer 706 may be 90°. For example, first spacer 706 may attach a configurable panel 712 to the door 714 at a first location. A second spacer 706 may be added and attached at a second location. If the first spacer 706 is an identical length as the second spacer 706 then the configurable panel 712 may be attached parallel to the door 714. If the spacer 706 lengths are identical then any changes to the lengths of the spacers may cause the configurable panel 712 to be askew to the first door 714.

If a first spacer 706A and a second spacer 706 B are not identical lengths, the configurable panel 712 may be at an orientation askew to the door 714. The first spacer 706A and second spacer 706B may be included in a fastener assembly. The first spacer 706A and second spacer 706B may be spacing mechanisms. If the configurable panel 712 is askew to the door 714, then the angle 721 between the configurable panel and at least the first spacer 706A or the second spacer 706B may be greater than 90°. If the second spacer 706B is longer than the first spacer 706A, then the configurable panel 712 may be askew such that the side of the configurable panel attached to the first spacer 706A is closer to the door 714. For example, the first spacer 706A may be 2 inches and the second spacer 706B may be 3 inches causing the configurable panel 712 to be askew to the door 714. The angle 721 may be 100° due to the length differences between the first spacer 706A and the second spacer 706B.

In various embodiments, the fastener assembly 706 may be attached at an angle on the door 714. To measure the angle of the configurable panel 712, the plane of the door 714 and the plane of the configurable panel 712 may be extended theoretically, to compare an angle at the theoretical intersection point between the plane of the configurable panel 712 and the plane of the door 714. The angle may be used to determine the orientation of the askew panel.

Figure 8:
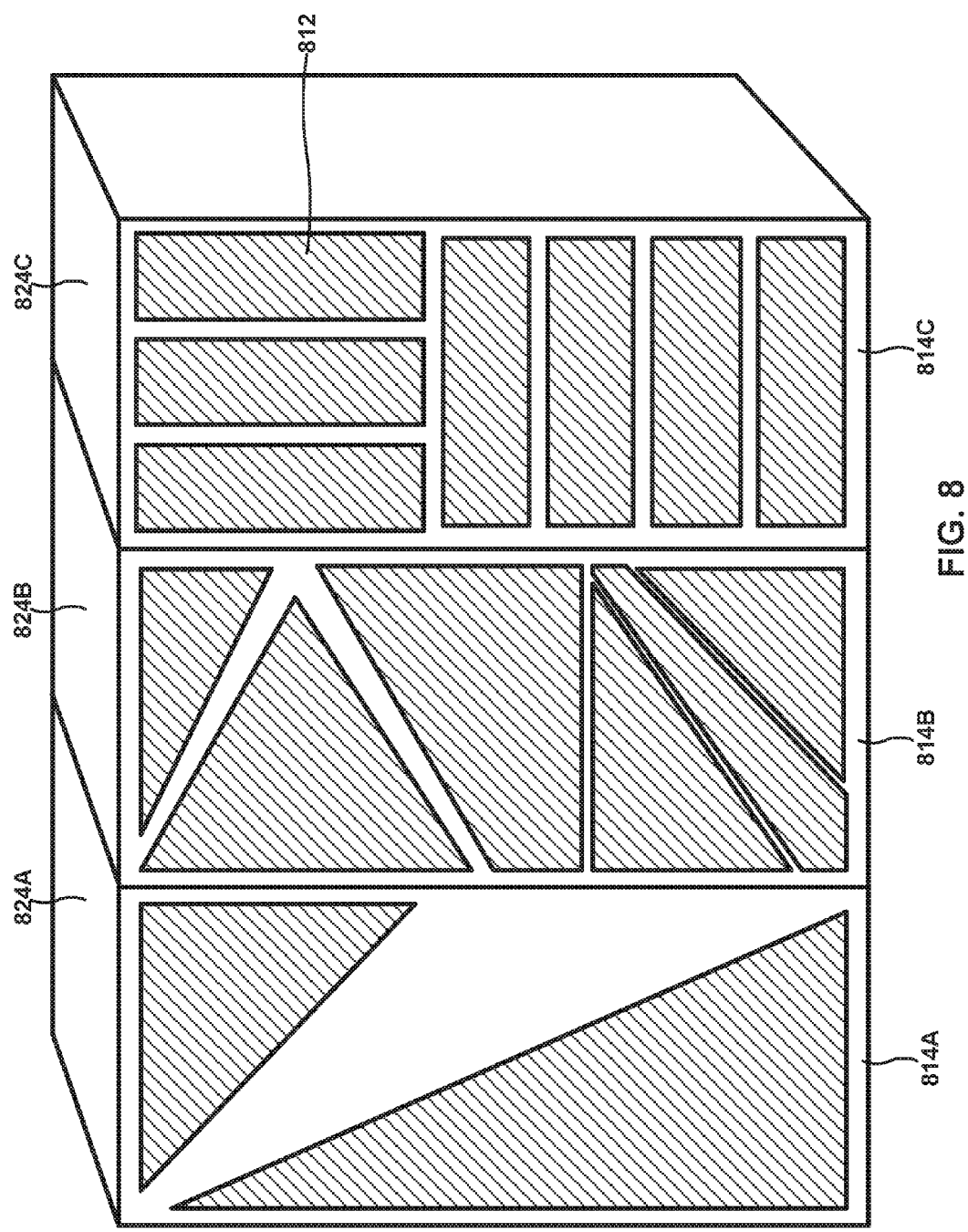
FIG. 8 depicts multiple enclosures fitted with an array of different configurable door panel covers, according to embodiments of the present disclosure.

FIG. 8 depicts multiple enclosures fitted with an array of different configurable door panel covers, according to embodiments. Multiple enclosures 824A-C may include multiple doors 814A-C. The enclosures 824A-C may include one or more walls and at least one door 814A-C that when combined create an enclosure with a cavity inside the combined one or more walls and door. The enclosure may include one or more components mounted within the cavity of the enclosure. The enclosure may be a server that may be configured to enclose and protect one or more computing components. For example, an enclosure may be a rack server enclosing and protecting one or more computing components that may be attached within the cavity of the enclosure. In an additional example, the enclosure may be a blade server enclosing and protecting one or more server blades mounted within the enclosure.

The server may include multiple mounting configurations that a user may alter based on computing needs of the user. Depending on the components within the enclosure, the amount of airflow required, the sound pressure output, and outputted EMF emissions may be based on the types of components within the enclosure. The components within the enclosure may include a computer system, or server blade that may require airflow for cooling, and output sound pressure or EMF emissions. For example, the enclosure may be an Information Technology (IT) server rack that is filled top to bottom with computing equipment. The top of the enclosure may be include computing equipment that generates a significant amount of heat requiring additional airflow, and the bottom of the enclosure may include loud computing equipment that requires additional acoustic attenuation. The configurable panels attached to the top of the enclosure may small, thin and attached further away from the door allowing additional airflow to enter the enclosure. The configurable panels attached to the bottom of the enclosure may include sound dampening foam, and attached closer to the enclosure to decrease the sound pressure that is emitted from the enclosure.

The doors 814A-C of the enclosures 824A-C may include a first door 814A attached to a first enclosure 824A, a second door 814B attached to a second enclosure 824B, and a third door 814C attached to a third enclosure 824C. Mounted to the doors 814A-C of the enclosure 824A-C may include one or more configurable panels 812. For example, the enclosure may include a component that requires airflow. To increase the airflow to the component, a configurable panel 812 may be adjusted at a further distance from the door of the enclosure.

Depending on the size, shape, mounting distance, mounting orientation, and composition of the configurable panels 812, the configurable panel 812 the same as another configurable panel 812 may provide different airflow, sound attenuation, or EMF dampening. For example, a first configurable panel 812 and a second configurable panel 812 that are both rectangular in shape 3 inches wide, and 5 inches in height. The first configurable panel may be attached at an orientation of the longest end lengthwise, and the second configurable panel may be attached at an orientation of the longest end vertically.

In various embodiments, enclosures 824A-C may share a wall with the neighboring enclosure. The walls of the enclosure 824A-C may include one or more shared walls with neighboring enclosures. For example, a wall on the right side of the first enclosure 824A that is also a wall on the left side of the second enclosure 824B.

Figure 9:
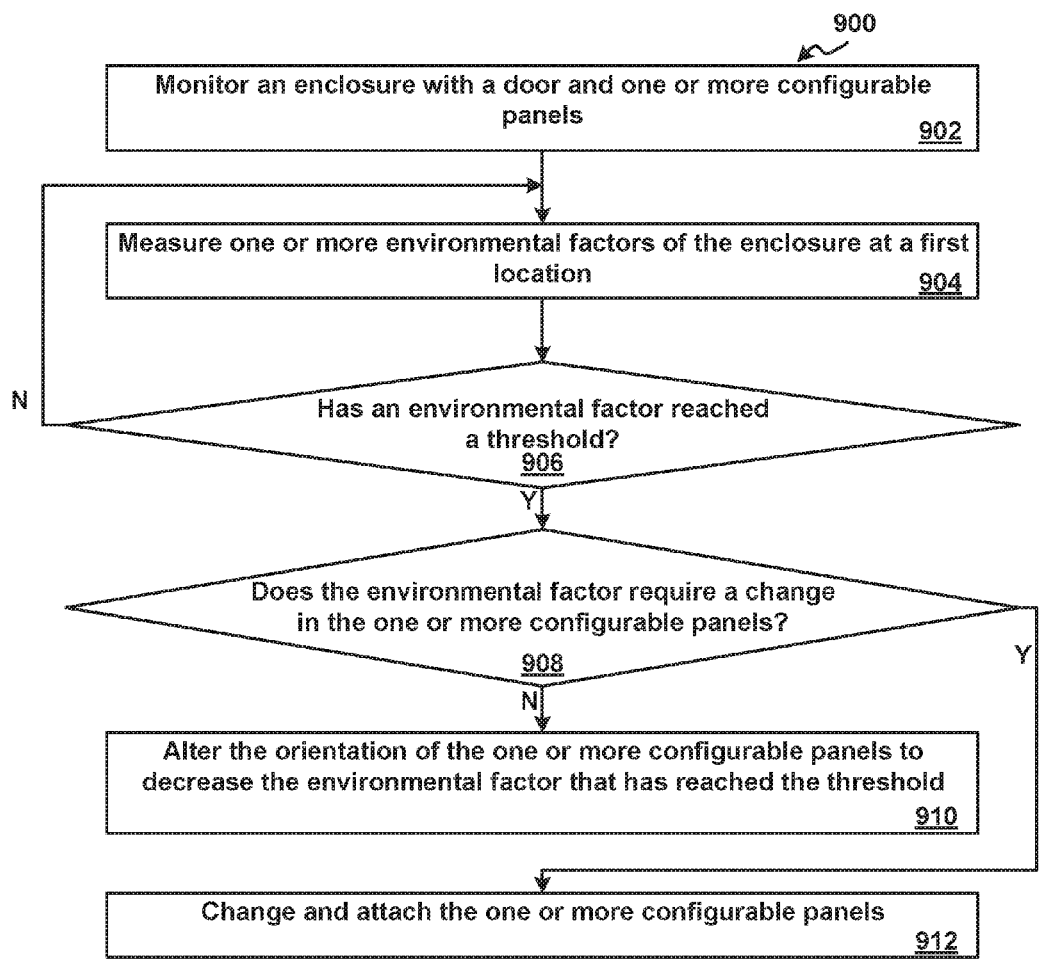
FIG. 9 depicts a method for determining a threshold being reached in response to one or more environmental factors of the enclosure, according to embodiments of the present disclosure.

FIG. 9 depicts a flow chart of a method 900 for determining a threshold being reached in response to one or more environmental factors of the enclosure, according to embodiments of the present disclosure. An environmental factor may include thermal properties of the enclosure, acoustical attenuation of the enclosure, and/or EMF emissions of the enclosure. Each of the environmental factors may be monitored by a computer system to determine if one or more environmental factors have reached a threshold.

In operation 902, a computer system may monitor one or more environmental factors of an enclosure that includes one or more configurable panels attached to a door of the enclosure. The one or more configurable panels may be adjusted in orientation or distance between the configurable panel and the door based on the environmental factors of the enclosure. For example, an environmental factor may be monitored at four different locations in front of the one or more configurable panels attached to the door of the enclosure outside the enclosure. The four locations may include a top left location, a top right location, a bottom left location, and a bottom right location.

In operation 904, the computer system measures one or more of the environmental factors of the enclosure. The measurement may include one or more measurement devices in one or more measurement locations to determine the environmental factors of the enclosure. Environmental factors may include the airflow within the enclosure, the sound pressure outside the enclosure, and the EMF emissions of the enclosure. The airflow as an environmental facture may be measured within the enclosure at one or more locations with an anemometer or air speed meter. The sound pressure as an environmental factor may be measured outside the enclosure at one or more locations with a decibel meter or sound pressure meter. The EMF emissions as an environmental factor may be measured outside the enclosure at one or more locations with an EMF detector.

In operation 906, the computer system determines if the measured environmental factor of the enclosure has reached a threshold. The threshold may be a measurement of the environmental factor that is deemed to be in excess or that is not enough where if the measurement reaches the threshold the environmental factor may cause damage to the components within the enclosure, or other objects or people outside the enclosure. For example, a threshold of the airflow may be set at 1 m/s if the airflow within the enclosure at one or more locations has reached the threshold of 1 m/s or below 1 m/s then the threshold has been reached. In an additional example, a threshold of the sound pressure may be set at 90 dB if the sound pressure outside the enclosure at one or more locations has reached the threshold of 90 dB or is above 90 dB then the threshold has been reached. In an additional example, a threshold of the EMF emissions pressure may be set at 2 mG if the EMF emissions outside the enclosure at one or more locations have reached the threshold of 2 mG or is above 2 mG then the threshold has been reached. If the measurement of the environmental factor has reached the threshold, then the method 900 may progress to operation 908. If the measurement of the environmental factor not reached the threshold, then the method 900 may return to operation 904.

In operation 908, a determination is made if the measurement of the environmental factor requires a change in the one or more configurable panels. A change in the one or more configurable panels may include removing a configurable panel, adding a configurable panel, or substituting a configurable panel. By changing the configurable panels of the enclosure, an environmental factor may be altered. A change in the one or more configurable panels may initiated if the current configurable panel is not the correct type of panel. For example, a current configurable panel may be constructed with sound dampening foam, but the measurement of the environmental factor requires an EMF panel. If the configurable panel is the incorrect type for the environmental factor that has reached the threshold and the configurable panel requires a change, then the method 900 may progress to operation 912. If the configurable panel is the correct type for the environmental factor that has reached the threshold and the configurable panel does not require a change, then the method 900 may progress to operation 910.

In operation 910, the orientation of the panel is altered to change the environmental factors of the enclosure. Altering the orientation may include moving the current configurable panel, changing the distance between the panel and the door, or tilting the configurable panel. For example, the configurable panel may be tilted 115% towards the top of the enclosure.

In operation 912, the current configurable panel may be changed for a determined second configurable panel. The second configurable panel may be selected to alter any of the environmental factors. The altering of the environmental factors may include changing the current configurable panel to a new second configurable panel. For example, the environmental factor of sound pressure may have reached the threshold of the sound pressure. The sound pressure may be 95 dB with a threshold of 90 dB, and therefore may require a change in the one or more configurable panels. The current configurable panel may switched for a second configurable panel that include sound dampening foam to decrease the sound pressure emitting from the enclosure. The second configurable panel may be attached to the door of the enclosure and the sound pressure may decrease to 86 dB.

Figure 10:
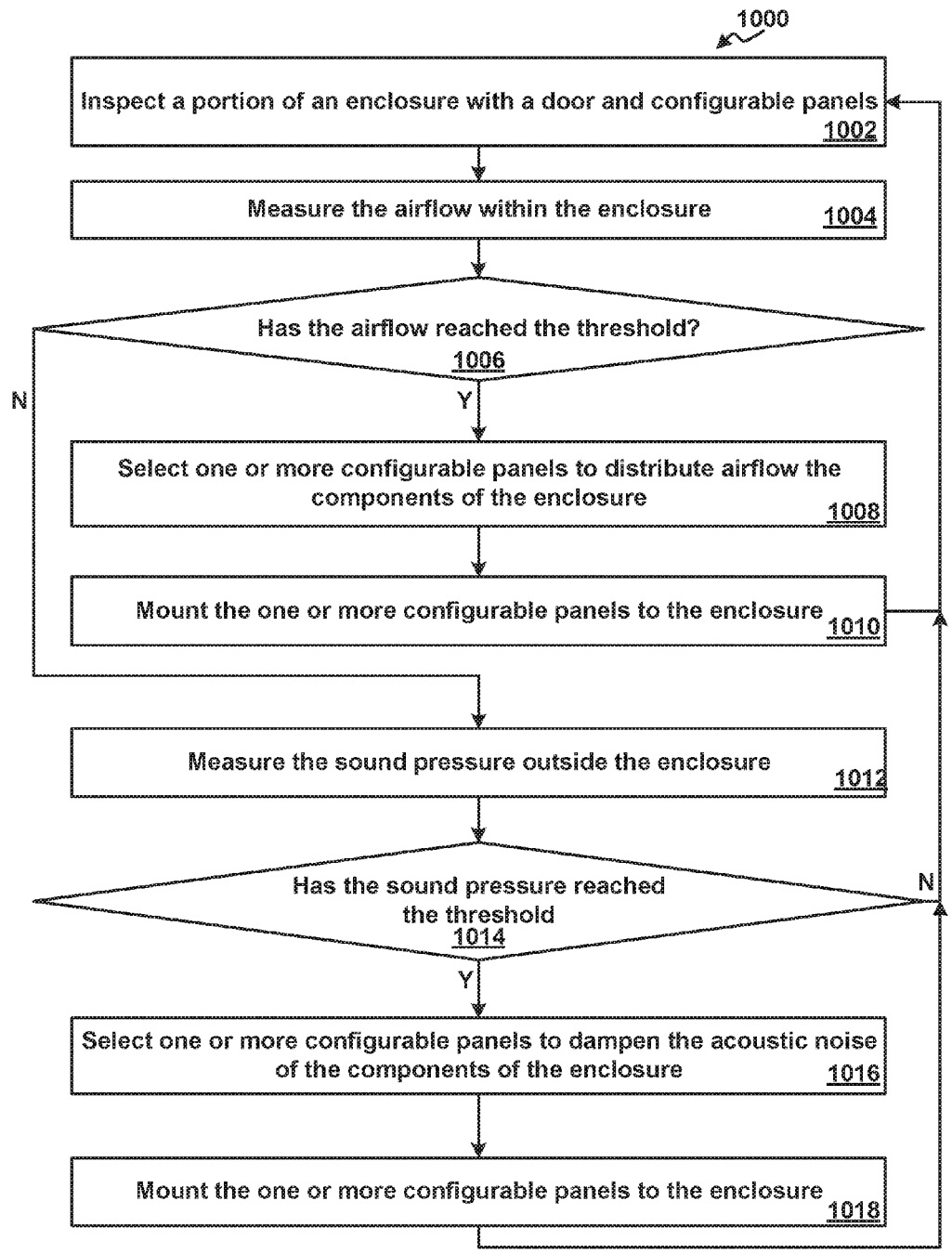
FIG. 10 depicts a method for determining a change in the configurable door panels in response to a threshold being reached, according to embodiments of the present disclosure.

FIG. 10 depicts a flow chart of a method 1000 for determining a change in the configurable door panels in response to a threshold being reached, according to embodiments. A user may monitor a threshold of an airflow within the enclosure, and a threshold of a sound pressure outside the enclosure. The user may then alter or replace the panels that are attached to the enclosure. One or more panels may be selected to be attached to the door of the enclosure based on the airflow within the enclosure or the sound pressure outside the enclosure. Airflow within the enclosure and sound pressure outside the enclosure may be used as continuous illustrative examples throughout the method 1000.

In operation 1002, a portion of the enclosure may be monitored for the thermal properties and acoustic attenuation. For example, a top half of an enclosure may be monitored within the enclosure and outside the enclosure. The inside of the enclosure, the cavity, may include an air speed monitor to measure the airflow within the enclosure. The outside of the enclosure, may include a sound pressure meter to measure the sound pressure outside the enclosure at the top half.

In operation 1004, the airflow within the enclosure may be measured. The airflow may be measured by a device such as an air speed monitor like an anemometer. The air speed monitor may measure the speed at which the air moves through the enclosure. The airflow may enter the door of the enclosure, pass through the computer components within the cavity of the enclosure, and exit the rear of the enclosure. The airflow may enter through the perforated first face of the door. For example, the air speed monitor may determine that the airflow is 1 m/s.

In operation 1006, the measured airflow is determined if the airflow within the enclosure has reached or exceeded a threshold. The measurement of the airflow may include comparing the measured airflow to a threshold of the airflow. The threshold may include a lower limit and when the airflow reaches or falls below the threshold an alert may be generated. The generated alert may inform a user that the airflow has reached the threshold, and instruct a user and/or an actuator to alter a configurable panel attached to the enclosure. For example, the threshold of the airflow may be set at 1 m/s. If the measured airflow is 0.95 m/s, then the measured airflow has been reached, and is below the threshold of the airflow. If the threshold of the airflow has been reached, then the method 1000 may progress to operation 1008. If the threshold of the airflow has not been reached, then the method 1000 may progress to operation 1012.

In operation 1008, the determination of the airflow reaching the threshold may cause the user to select one or more configurable panels to increase the airflow within the enclosure. The selection of one or more configurable panels may include attaching a configurable panel, removing a configurable panel, orienting a configurable panel, and/or substituting a configurable panel. For example, a first configurable panel may be detached from the door of the enclosure to increase the airflow within the enclosure. In an additional example, a first configurable panel may be substituted for a second configurable panel to increase the airflow within the enclosure.

In operation 1010, the one or more panels to increase the airflow are attached to the door and are oriented to increase the airflow within the enclosure. A new configurable panel may be attached to the door of the enclosure, an old configurable panel may be detached from the door of the enclosure, and/or a configurable panel may be oriented on the door of the enclosure. For example, the measured airflow within the enclosure before altering the panels may be 0.95 m/s with a threshold of 1.0 m/s, since the airflow is below the threshold, then an alert may cause the selection and attachment of a selected configurable panels. The selection and attachment of the one or more configurable panels may increase the airflow to 1.1 m/s, which is above the threshold and therefore may not generate an alert.

In operation 1012, the sound pressure is measured outside the enclosure at a set distance from the enclosure. The sound pressure may be measured by a device such as a sound pressure monitor such as a decibel meter. The decibel meter may measure the sound pressure at a location a set distance away from the enclosure outside the enclosure. The sound pressure may be outputted through the door of the enclosure, or other parts of the enclosure. For example, the decibel meter may determine that the sound pressure at a first location is 95 dB.

In operation 1014, the measured to determine if the sound pressure has reached or exceeded the threshold of the sound pressure. If the sound pressure has reached or exceeded the threshold, then a computer system may issue an alert to the user to change or alter the one or more configurable panels. The threshold may include an upper limit and when the sound pressure reaches or is above the threshold an alert may be generated. The generated alert may inform a user that the sound pressure has reached the threshold, and instruct a user and/or an actuator to alter a configurable panel attached to the enclosure. For example, the threshold of the sound pressure may be set at 90 dB. If the measured sound pressure is 95 dB, then the measured sound pressure has been reached and is above the threshold of the sound pressure. If the threshold of the sound pressure has been reached, then the method 1000 may progress to operation 1016. If the threshold of the sound pressure has not been reached, then the method 1000 may return to operation 1002.

In operation 1016, the determination of the sound pressure reaching the threshold may cause the user to select one or more configurable panels to decrease the sound pressure outside the enclosure at the set distance. The selection of one or more configurable panels may include attaching a configurable panel, removing a configurable panel, orienting a configurable panel, and/or substituting a configurable panel. For example, a first configurable panel may be attached to the door of the enclosure to decrease the sound pressure. In an additional example, a first configurable panel may be substituted for a second configurable panel to decrease the sound pressure.

In operation 1018, the one or more panels to decrease the sound pressure are attached to the door and are oriented to decrease the sound pressure outside the enclosure at the set distance. A new configurable panel may be attached to the door of the enclosure, an old configurable panel may be detached from the door of the enclosure, and/or a configurable panel may be oriented on the door of the enclosure. For example, the measured sound pressure at the set distance from the enclosure before altering the one or more configurable panels may be 95 dB with a threshold of 90 dB, since the sound pressure is above the threshold, then an alert may cause the selection and attachment of the selected one or more configurable panels. The selection and attachment of the one or more configurable panels may decrease the sound pressure to 88 dB, which is below the threshold and therefore may not generate an alert.

Figure 11:
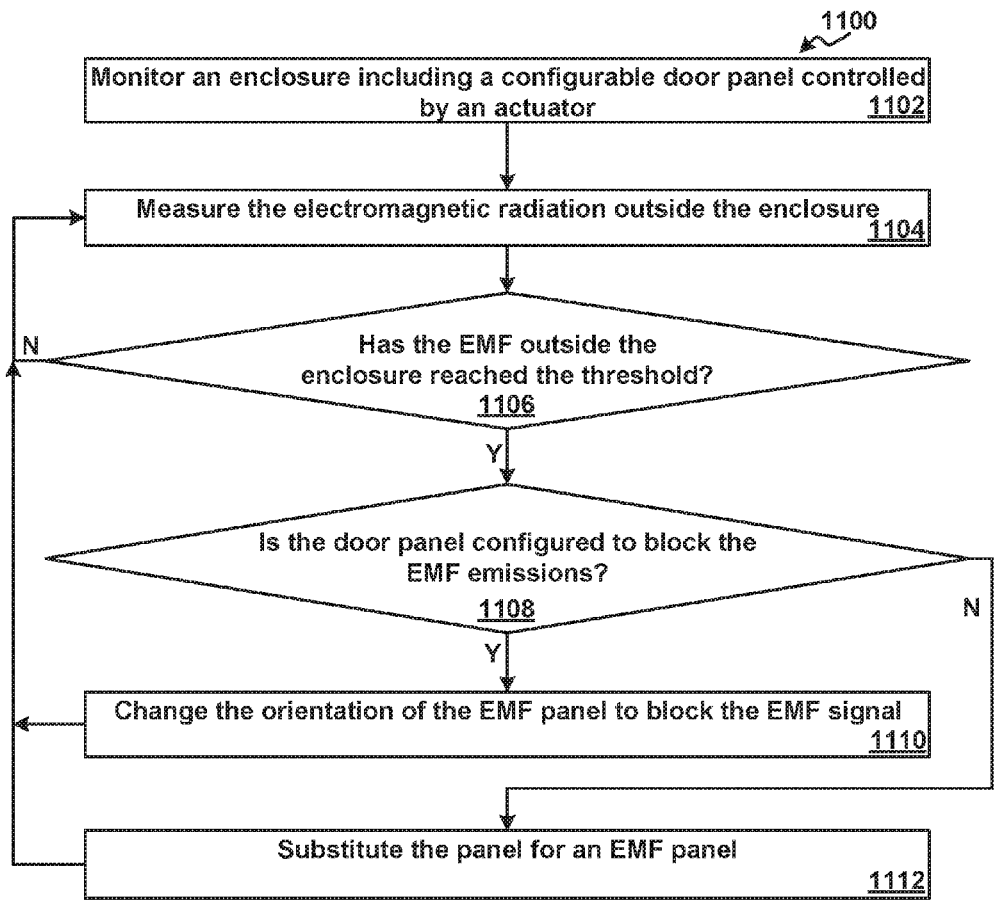
FIG. 11 depicts a method for determining a change in an orientation of a configurable door panel cover in response to the electromagnetic frequency reaching a threshold, according to embodiments of the present disclosure.

FIG. 11 depicts a flowchart of a method 1100 for determining a change in an orientation of a configurable door panel cover in response to the electromagnetic frequency (EMF) reaching a threshold, according to embodiments. The enclosure may emit electromagnetic radiation (EMR) or EMF that may be reduced by altering an orientation of one or more configurable panels, or substituting a first configurable panel for a second configurable panel (EMF panel) that blocks EMF.

In operation 1102, a computer system may monitor an enclosure including a configurable door panel controlled by an actuator. The computer system may monitor one or more locations outside the enclosure to determine if the EMF emissions at the one or more locations have reached a threshold of the EMF. For example, an EMF may be monitored at four different locations in front of the one or more configurable panels attached to the door of the enclosure. The four locations may include a top left location, a top right location, a bottom left location, and a bottom right location.

In operation 1104, the EMF emissions from the enclosure are measured at the one or more locations. The measurements of the EMF emissions at the one or more locations may be sent to the computer system, which may inform one or more actuators to alter the distance or orientation of the one or more configurable panels. The EMF emissions may be measured by an EMF detector. For example, the EMF emissions may be measured at four different locations including an EMF emission of 1.1 mG at the top left location, an EMF emission of 1.5 mG at the top right location, an EMF emission of 2.2 mG at the bottom left location, and an EMF emission of 1.7 mG at the bottom right location.

In operation 1106, the computer system may compare the measured EMF emissions at the one or more locations outside the enclosure to a threshold of the EMF emissions and determine if the EMF emissions at the one or more locations has reached the threshold of the EMF emissions. If the measured EMF emission has reached the threshold of the EMF emissions, then the computer system may issue an alert to the user and/or alter the orientation or location of the one or more configurable panels to decrease the EMF emissions at the one or more measured locations. For example, the bottom left location of an EMF emission of 2.2 mG may have reached the threshold of the EMF emissions set at 2.0 mG. The computer system may then issue an alert and/or change the orientation of one or more configurable panels associated with the EMF emissions of the bottom left location. If the computer system issues an alert, then the method 1100 may progress to operation 1108. If the computer system does not issue an alert, then the method 1100 may return to operation 1104.

In operation 1108, a determination is made on the composition of the configurable panel. The configurable panel may be constructed out of EMF emission reflective or dissipative material and may be termed an EMF panel. For example, the EMF emission of the bottom left of the door with an EMF emission of 2.2 mG mat not include an EMF panel. If the configurable panel is not an EMF panel, then a substitution for an EMF panel is implemented. If the configurable panel is an EMF panel, then the method 1100 may progress to operation 1110. If the configurable panel is not an EMF panel or if the EMF measurement it too high with an EMF panel, then the method may process to operation 1112.

In various embodiments, a configurable panel may include an ID code that associates the configurable panel with the composition or type of panel and the physical qualities of the panel. The type of panel may include an acoustic panel including sound dampening foam or an EMF panel that is constructed to reflect EMF emissions. The physical qualities may include a panel of a square shape or a 3D triangular shape. For example, panel number 2456 could be an EMF panel of a triangular shape.

In operation 1110, the orientation of the EMF panel is changed to block or reflect the EMF emissions of the enclosure. Changing the orientation may include changing a distance between the EMF panel and the door of the enclosure, changing an angle of the EMF panel and the fastener assembly, and/or altering the location of the EMF panel on the door. For example, changing the orientation of the EMF panel may include moving the EMF panel 1 inch closer to the door of the enclosure. Reducing the distance between the EMF panel and the door may decrease the measured EMF emissions of the bottom left portion of the door of the enclosure from 2.2 mG to 1.98 mG.

In operation 1112, the configurable panel is substituted for an EMF panel configured to block the EMF emissions of the enclosure. If the configurable panel is not an EMF panel or is and EMF panel that is insufficient in reducing the EMF emissions may be substituted for an EMF panel, or a different EMF panel. A different EMF panel may include an EMF panel that is larger in size, thicker in size, or more efficiently constructed. For example, a configurable panel attached to the door and located on the bottom left of the door of the enclosure may not be an EMF panel where a measured EMF emission may be 2.2 mG. The configurable panel may be substituted for an EMF panel to reduce the measured EMF emission to 1.85 mG. In an additional example, the configurable panel may be a first EMF panel attached to the door and located in the bottom left of the door of the enclosure measuring an EMF emission of 2.2 mG. The first EMF panel may be substituted for a second EMF panel that is thicker; the substitution for the second EMF panel may reduce the measured EMF emissions to 1.65 mG.

Figure 12:
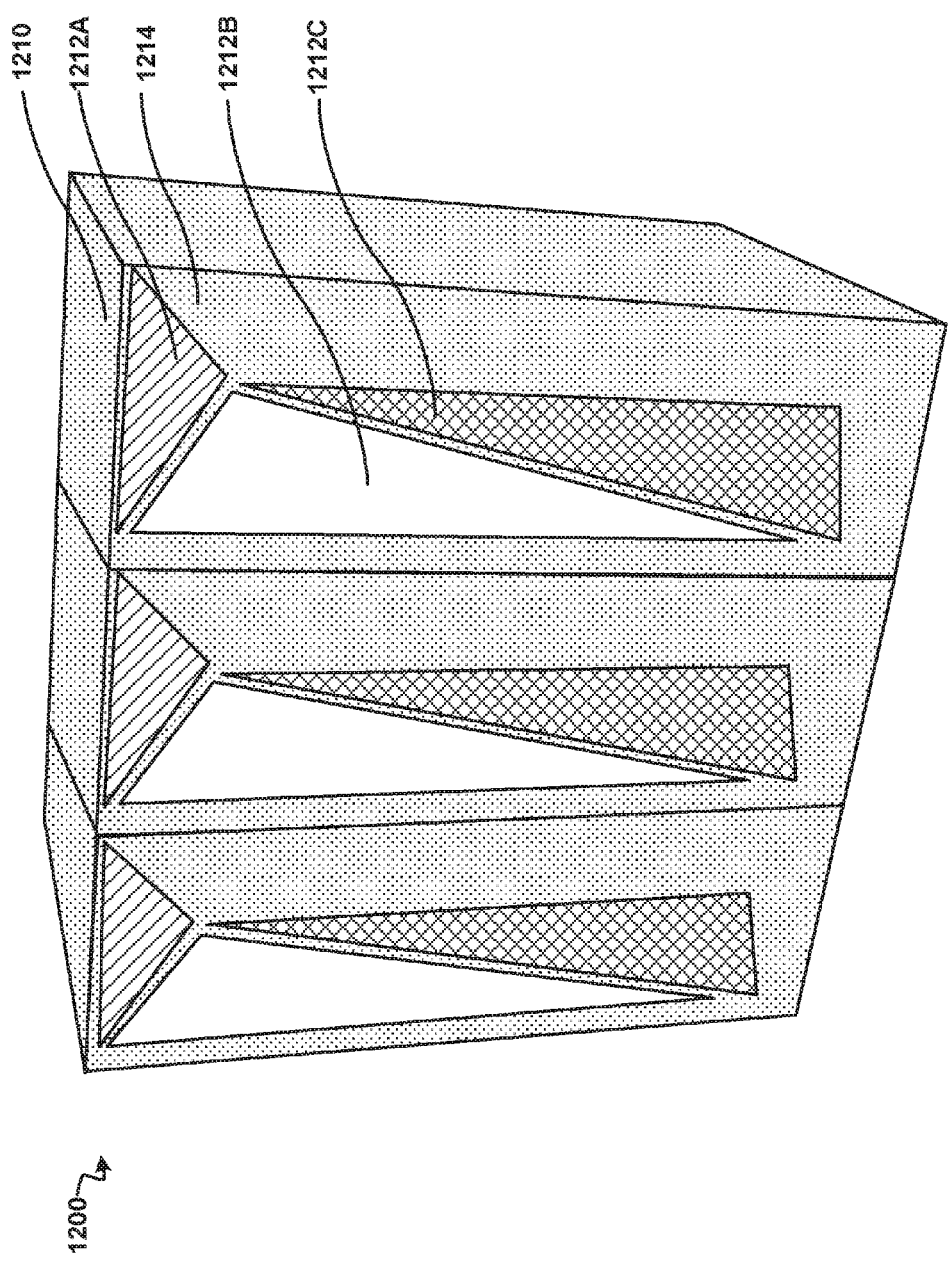
FIG. 12 depicts a three-dimensional illustration of configurable panels being attached to doors of multiple enclosures, according to embodiments of the present disclosure.

FIG. 12 depicts a three-dimensional illustration of configurable panels being attached to doors of multiple enclosures, according to embodiments. The illustration 1200 includes one or more enclosures 1210 that each includes a first door 1214 where one or more configurable panels including a first configurable panel 1212 A, a second configurable panel 1212 B and a third configurable panel 1212C (the three configurable panels 1212) are attached. The 3D illustration 1200 includes three enclosures 1210 each including a door 1214 where three configurable panels 1212 are attached. The three configurable panels 1212 of each enclosure 1210 may be attached at an orientation relative to a first face of the door 1214 of the enclosure 1210. In various embodiments, the orientation may include a first configurable panel 1212A attached with a first fastener assembly where the first configurable panel is at a first angle to the first face 1214 of the first door of the enclosure 1210. For example, the first orientation of the first configurable panel 1212A may be a result of the first angle being a 15° tilt toward the bottom of the first face of the door 1214 of the enclosure 1210. The second configurable panel 1212B attached with a second fastener assembly where the second configurable panel is at a second angle to the first face 1214 of the first door of the enclosure 1210. For example, the second orientation of the second configurable panel 1212B may be a result of the second angle being a 10° tilt toward the bottom left of the first face of the door 1214 of the enclosure 1210. The third configurable panel 1212C attached with a third fastener assembly where the third configurable panel is at a third angle to the first face 1214 of the first door of the enclosure 1210. For example, the third orientation of the second configurable panel 1212C may be a result of the third angle being a 20° tilt toward the top right of the first face of the door 1214 of the enclosure 1210.

Depending on the size, shape, mounting distance, mounting orientation, and composition of the configurable panels 1212, a first configurable panel 1212A the same size and shape as a second configurable panel 1212B but may provide different airflow, sound attenuation, or EMF dampening. For example, a first configurable panel 1212A and a second configurable panel 1212B that are both triangular in shape with three edges including a first edge of 3 inches a second edge of 4 inches and a third edge of 5 inches. The first configurable panel 1212A may be attached at a first orientation of the longest end lengthwise, and the second configurable panel 1212B may be attached at a second orientation of the longest end vertically. By attaching the first configurable panel 1212A in a different first orientation compared to the second configurable panel 1212B at the second orientation, the first configurable panel may provide a different airflow, sound attenuation, or EMF dampening when compared to the second configurable panel at the second orientation.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A configurable door panel cover apparatus, comprising:
   a first door having a first face, wherein the first face is perforated and includes one or more attachment points;
   a first configurable door panel cover with a three dimensional shape that attaches to the first face of the first door at the one or more attachment points, the configurable door panel cover, including:
   a detachable attachment point,
   sound dampening material, and
   electromagnetic field dampening material;
   a fastener assembly, including:
   at least one ball joint fastener that attaches to the detachable attachment point of the first configurable door panel cover, and
   an actuating spacing mechanism;
   a first configuration that attaches to the at least one ball joint fastener and to one or more attachment points on the first face of the first door, the first configuration including:
   the actuating spacing mechanism at a first length producing a first orientation and a first angle between the configurable door panel cover and the actuating spacing mechanism, wherein the at least one ball joint fastener is rotated with respect to the configurable door panel cover; and
   altering the spacing mechanism from the first configuration to the second configuration, when a second configuration is required, the second configuration including:
   the actuating spacing mechanism having a second length producing a second orientation and the ball joint fastener rotatably orienting the configurable door panel cover to a second angle of the second configuration between the configurable door panel cover and actuating spacing mechanism.

* * * * *